US012751302B2

(12) United States Patent
Kwon et al.

(10) Patent No.: US 12,751,302 B2
(45) Date of Patent: Sep. 29, 2026

(54) CIRCUIT BOARD AND SEMICONDUCTOR PACKAGE COMPRISING SAME

(71) Applicant: LG INNOTEK CO., LTD., Seoul (KR)

(72) Inventors: Myung Jae Kwon, Seoul (KR); Sang Hyuck Nam, Seoul (KR); Sang Hyun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 59 days.

(21) Appl. No.: 18/294,320

(22) PCT Filed: Aug. 2, 2022

(86) PCT No.: PCT/KR2022/011381
§ 371 (c)(1),
(2) Date: Feb. 1, 2024

(87) PCT Pub. No.: WO2023/014039
PCT Pub. Date: Feb. 9, 2023

(65) Prior Publication Data

US 2024/0339413 A1 Oct. 10, 2024

(30) Foreign Application Priority Data

Aug. 2, 2021 (KR) ........................ 10-2021-0101422

(51) Int. Cl.
*H05K 1/02* (2006.01)
*H10W 70/60* (2026.01)
(Continued)

(52) U.S. Cl.
CPC .......... *H10W 70/65* (2026.01); *H05K 1/0296* (2013.01); *H10W 70/611* (2026.01); *H10W 90/401* (2026.01)

(58) Field of Classification Search
CPC ........ H05K 1/02; H05K 1/115; H05K 1/0271; H10W 70/685; H10W 70/65
(Continued)

(56) References Cited

U.S. PATENT DOCUMENTS

2002/0192857 A1 12/2002 Igarashi et al.
2009/0126982 A1 5/2009 Nakamura et al.
2017/0040249 A1 2/2017 Yanagisawa et al.

FOREIGN PATENT DOCUMENTS

JP 10-242623 A 9/1998
JP 2003-7917 A 1/2003
(Continued)

OTHER PUBLICATIONS

Anonymous., "Electronic PCB Manufacturing and Assembly," ExPlus, XP093213172, Jan. 1, 2020, pp. 1-4.

*Primary Examiner* — Tremesha W Burns
(74) *Attorney, Agent, or Firm* — Birch, Stewart, Kolasch & Birch, LLP

(57) ABSTRACT

A circuit board according to an embodiment includes an insulating layer, a first circuit pattern layer, and a first protective layer having a width narrower than a width of the insulating layer. Further. a second circuit pattern layer is disposed under the insulating layer, and a second protective layer also disposed under the second circuit pattern layer has a width narrower than the width of the insulating layer. Also, a first surface of the insulating layer includes a first region overlapping the first protective layer, and a second region excluding the first region. Further, a second surface opposite to the first surface of the insulating layer includes a third region overlapping the second protective layer in the vertical direction, and a fourth region excluding the third region with a portion of the second region overlapping a portion of the fourth region.

12 Claims, 26 Drawing Sheets

(51) Int. Cl.
*H10W 70/65* (2026.01)
*H10W 90/00* (2026.01)

(58) Field of Classification Search
USPC .......................................................... 174/250
See application file for complete search history.

(56) References Cited

FOREIGN PATENT DOCUMENTS

| | | | |
|---|---|---|---|
| JP | 2015-204379 | A | 11/2015 |
| JP | 2017-38044 | A | 2/2017 |
| KR | 10-2009-0049998 | A | 5/2009 |
| KR | 10-2013-0071878 | A | 7/2013 |
| KR | 10-2020-0139420 | A | 12/2020 |
| KR | 10-2022-0092236 | A | 7/2022 |

【FIG. 1】
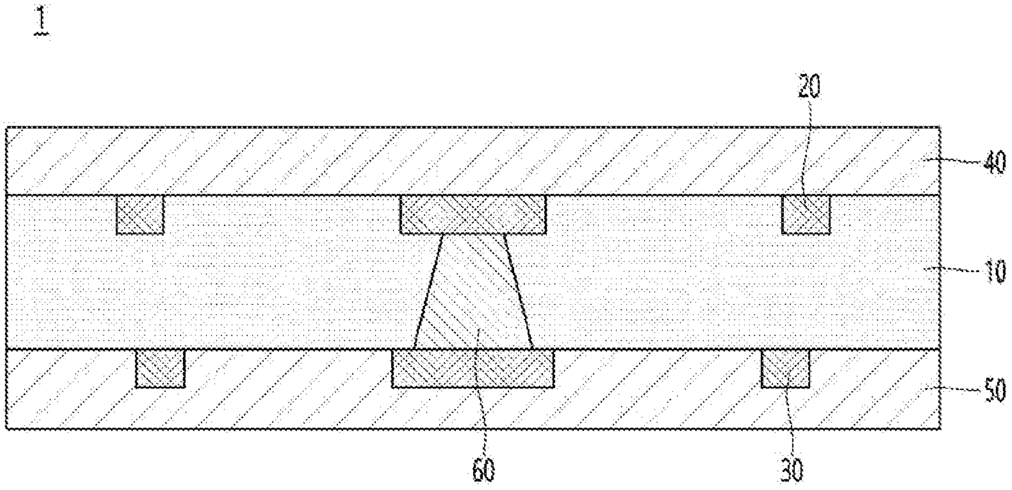
(a)
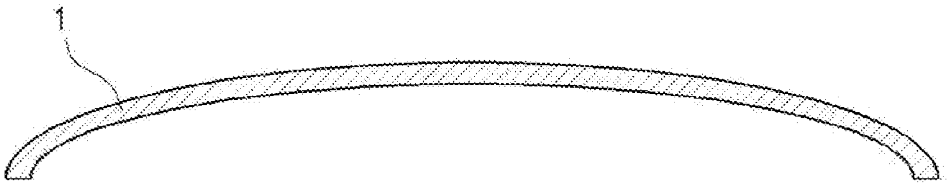
(b)

【FIG. 2A】
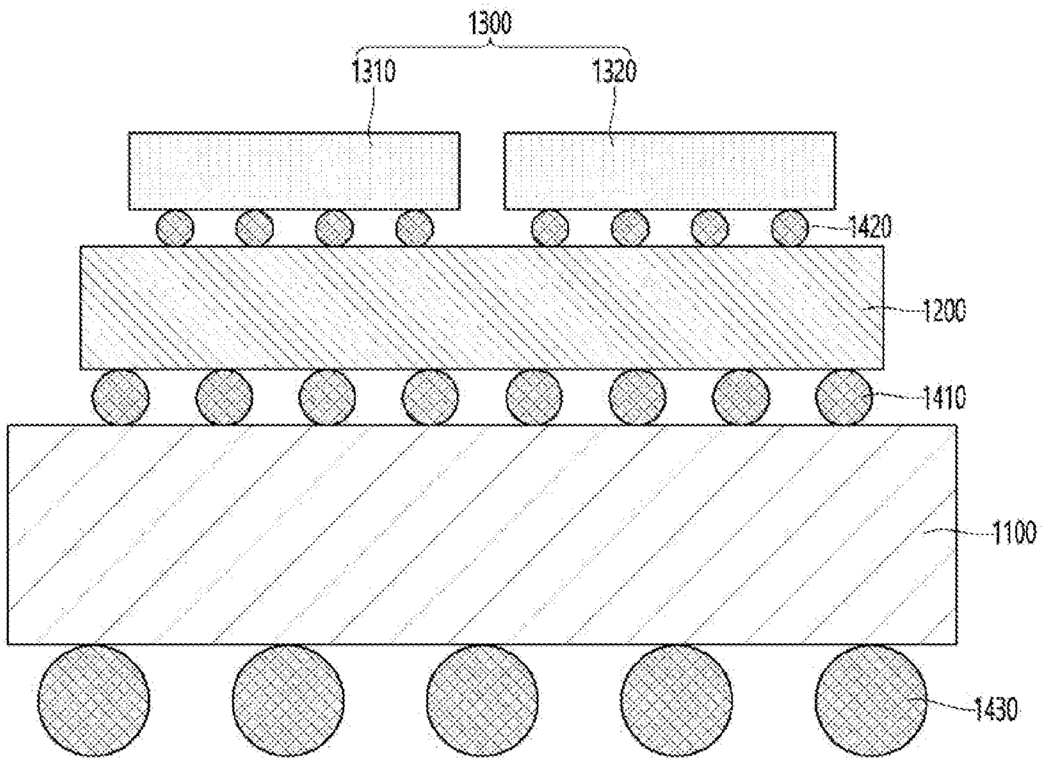

【FIG. 2B】
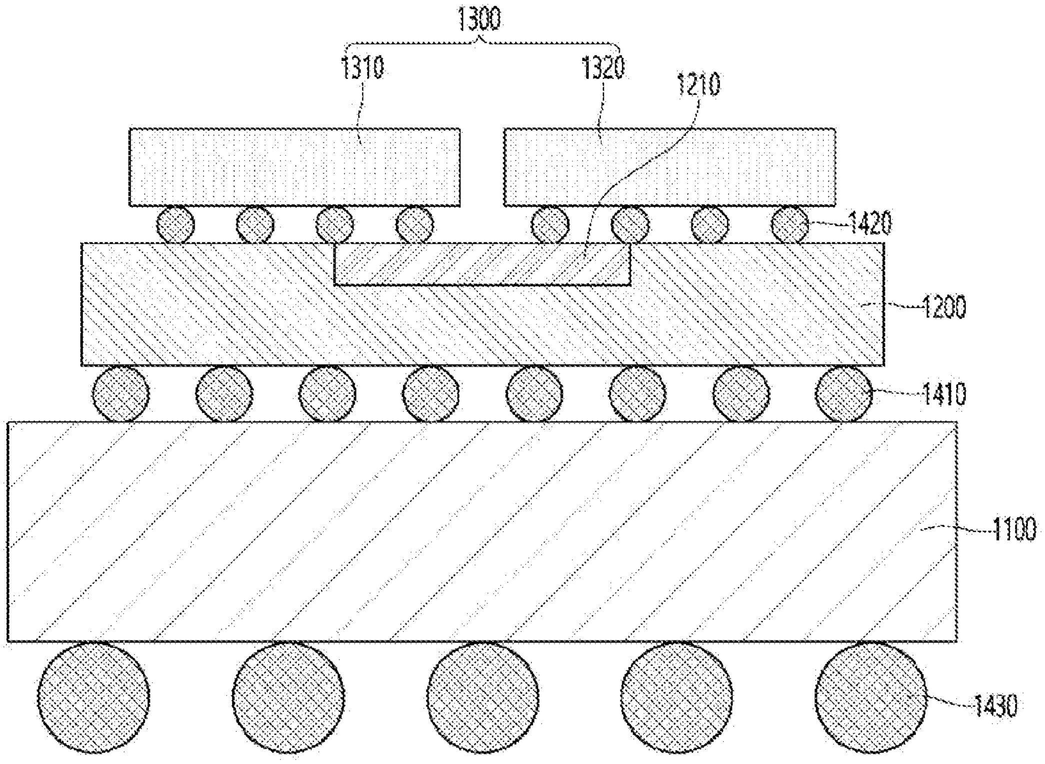

【FIG. 2C】
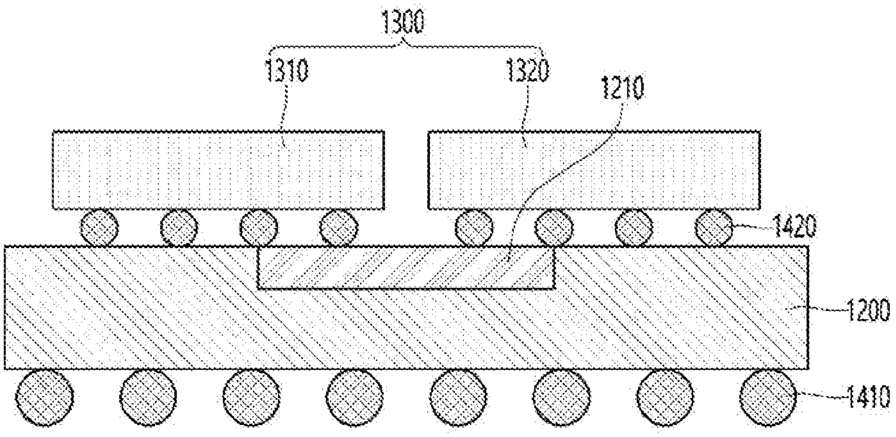
【FIG. 2D】
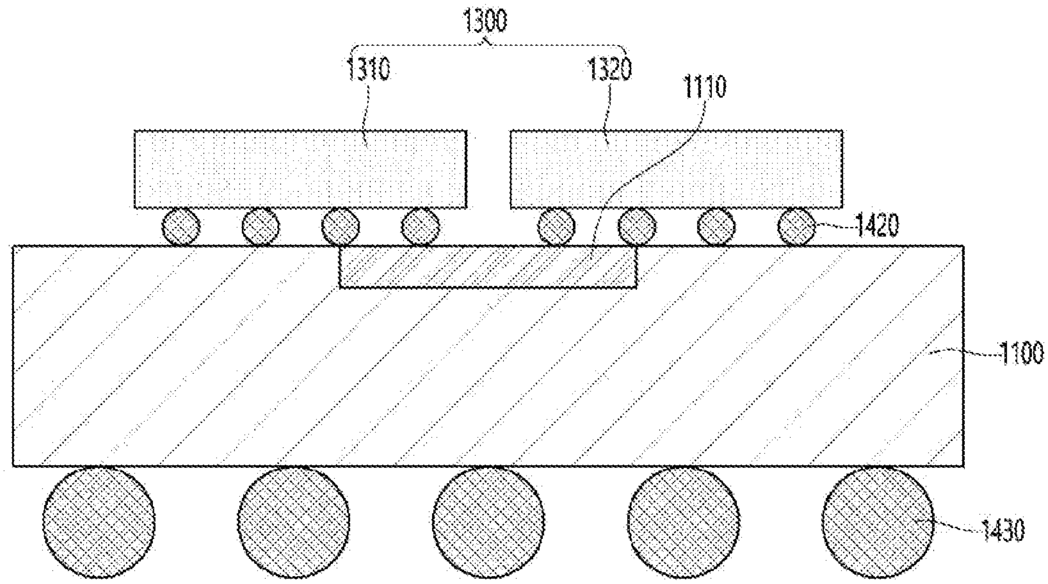

【FIG. 2E】
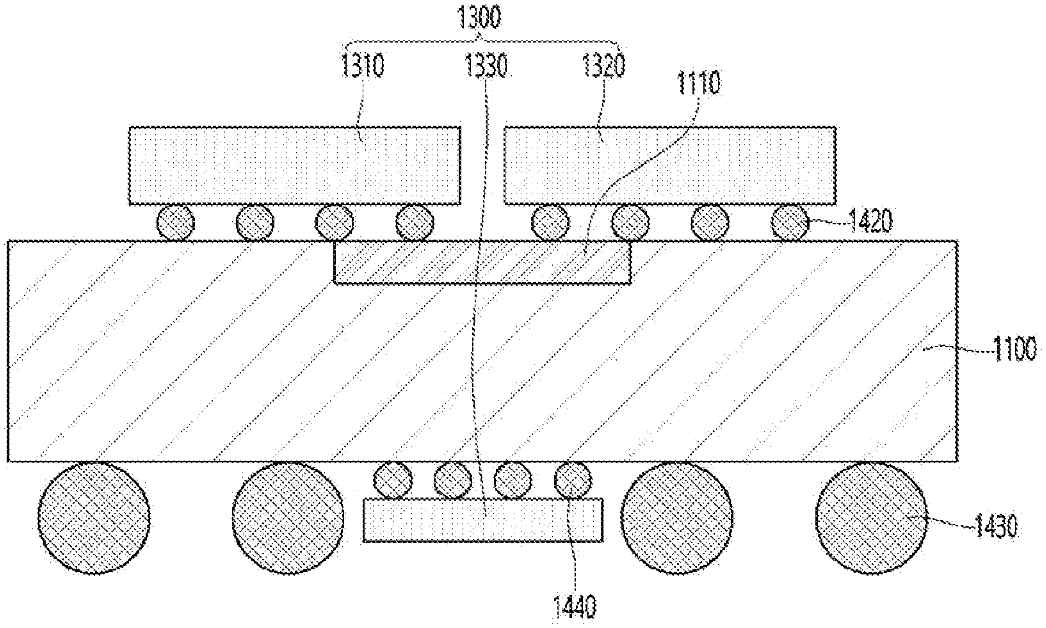

【FIG. 2F】
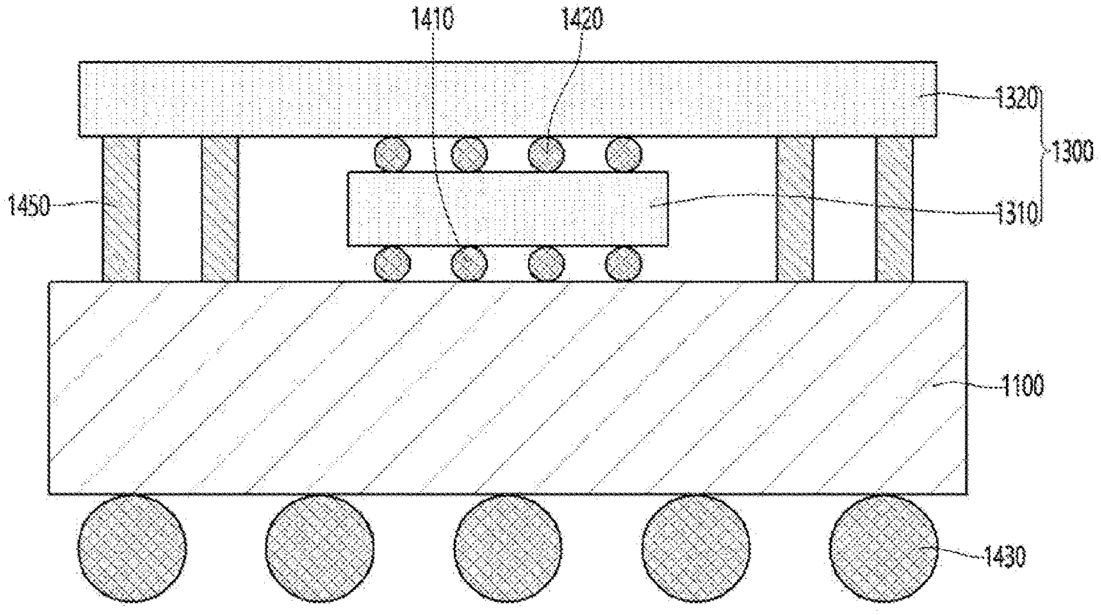

【FIG. 2G】
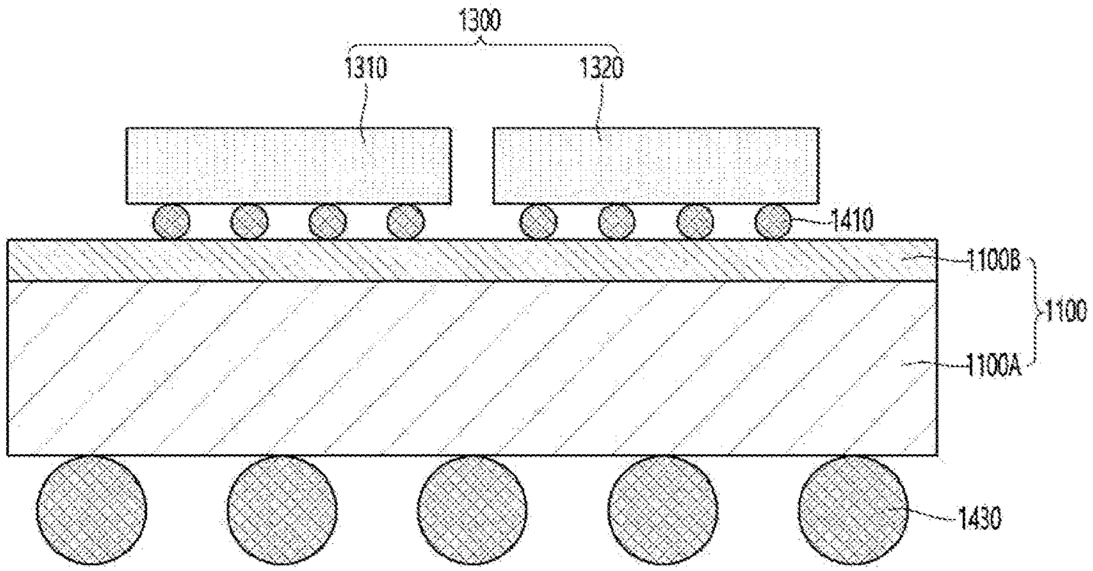

【FIG. 3A】
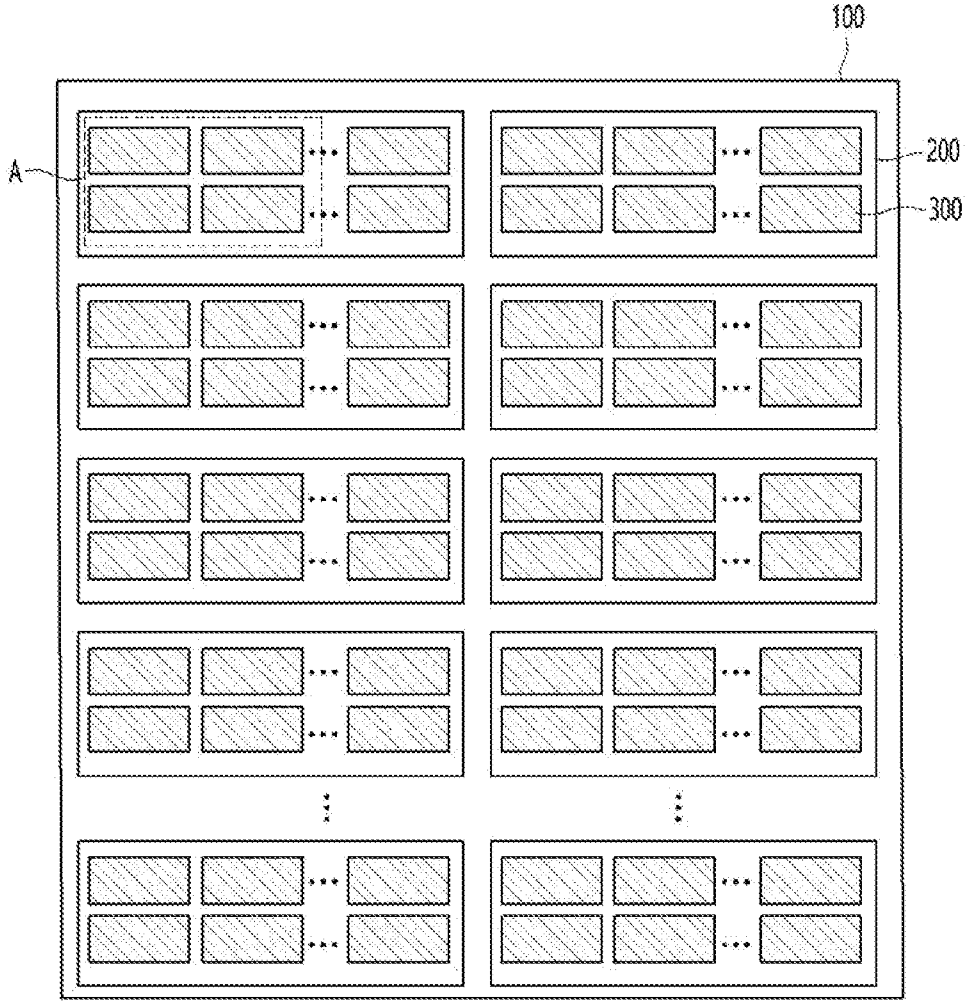

【FIG. 3B】
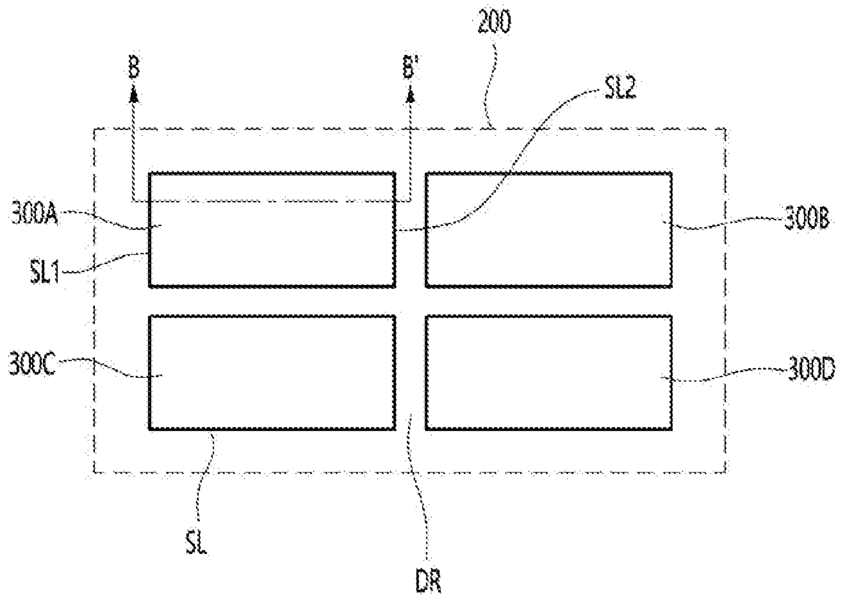

【FIG. 4】
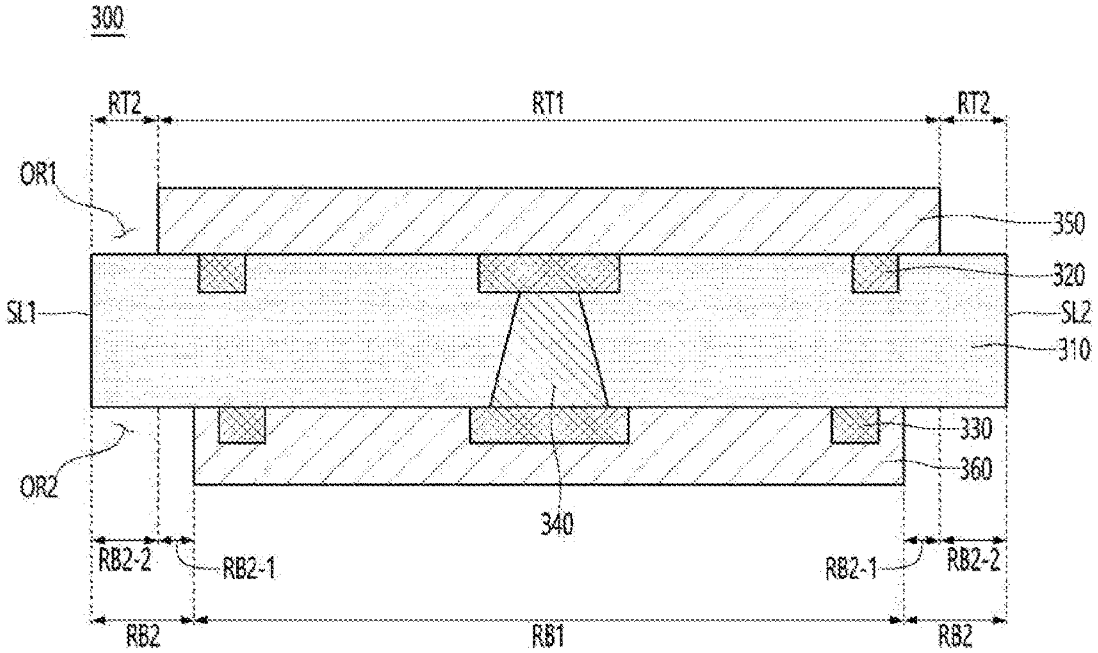

【FIG. 5A】
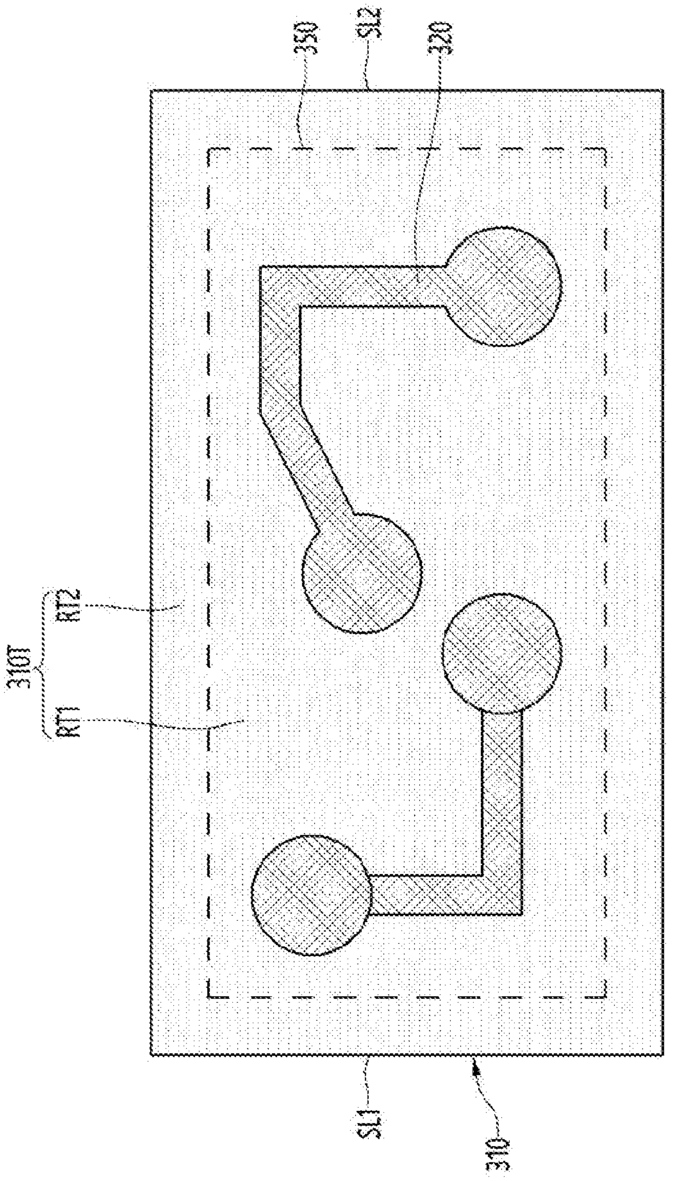

【FIG. 5B】
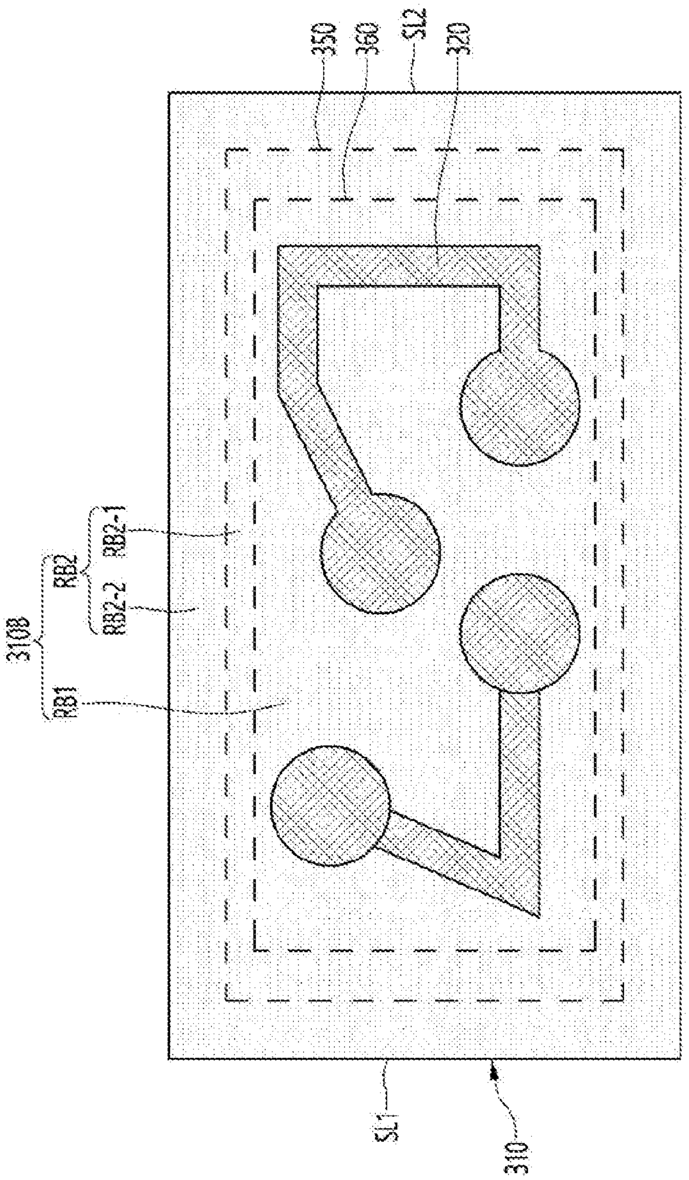

【FIG. 6A】
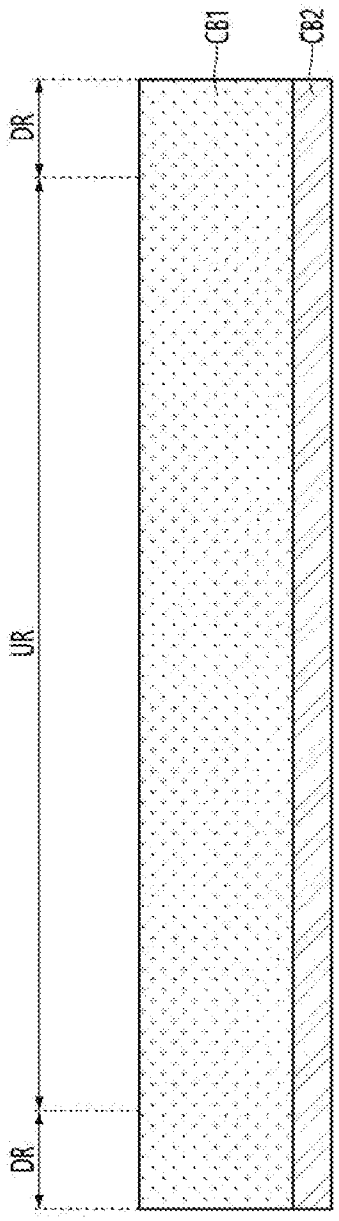

【FIG. 6B】
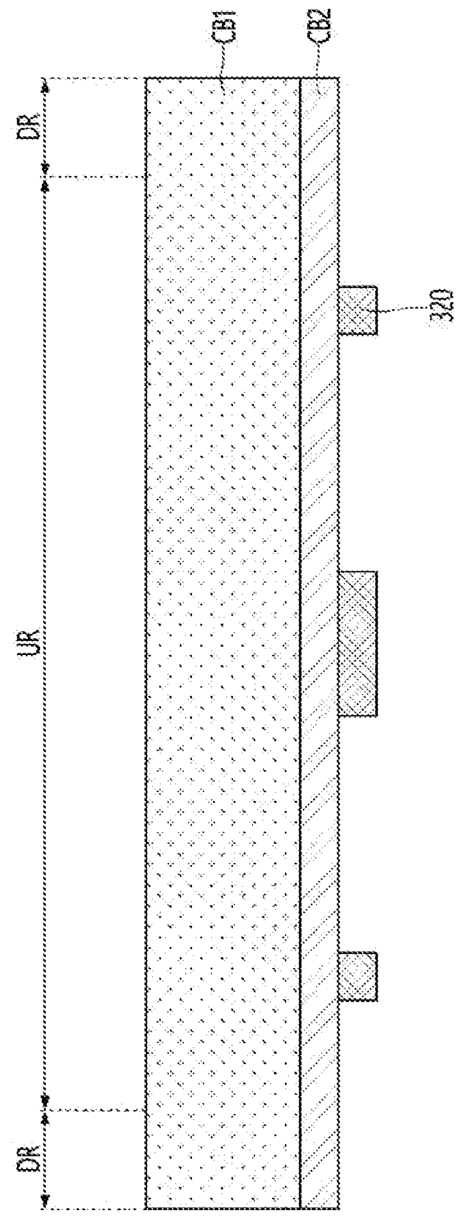

【FIG. 6C】
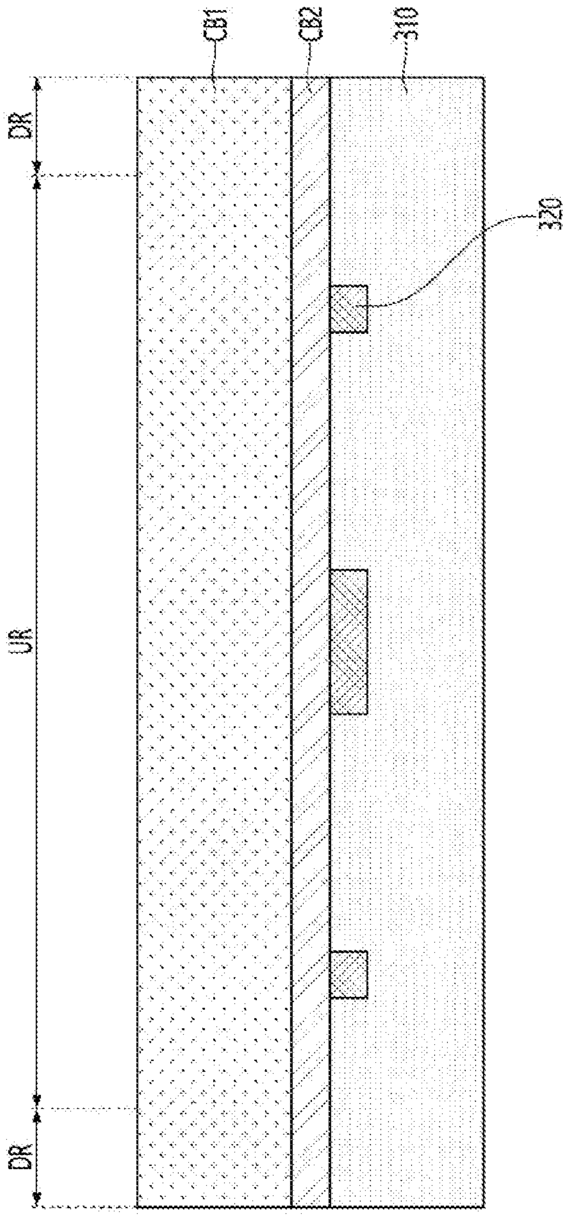

【FIG. 6D】
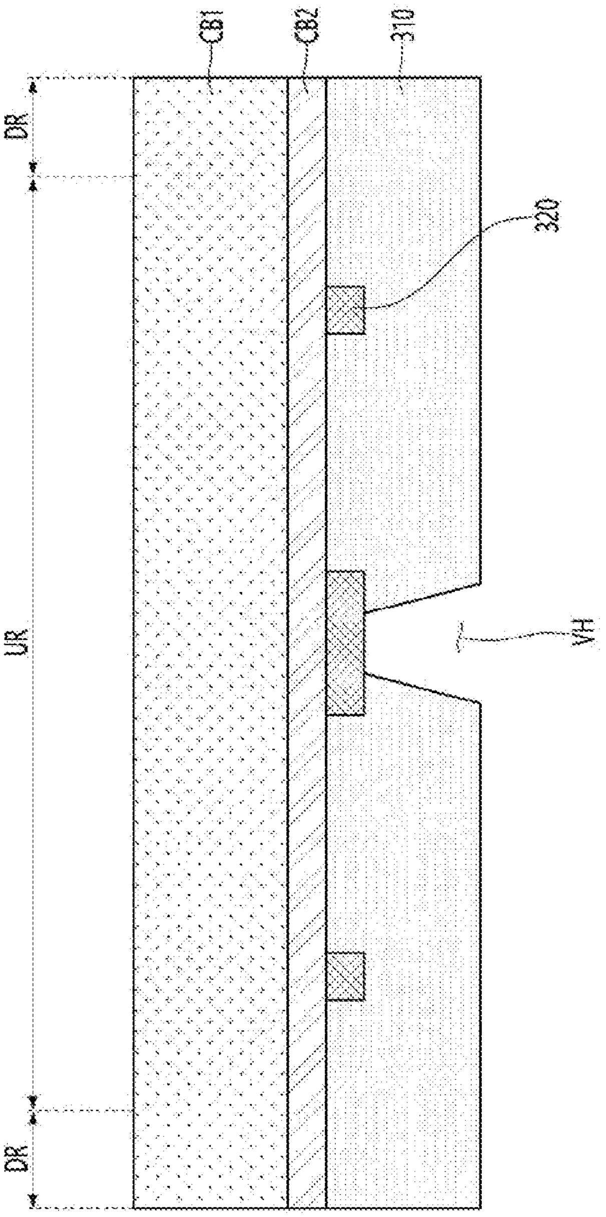

【FIG. 6E】
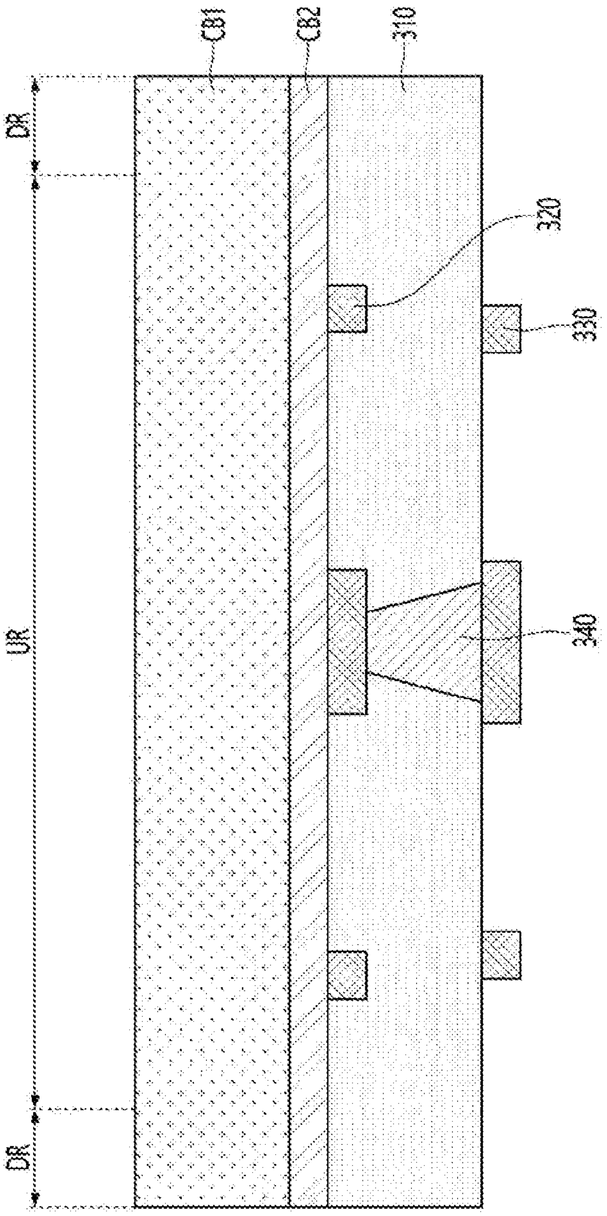

【FIG. 6F】
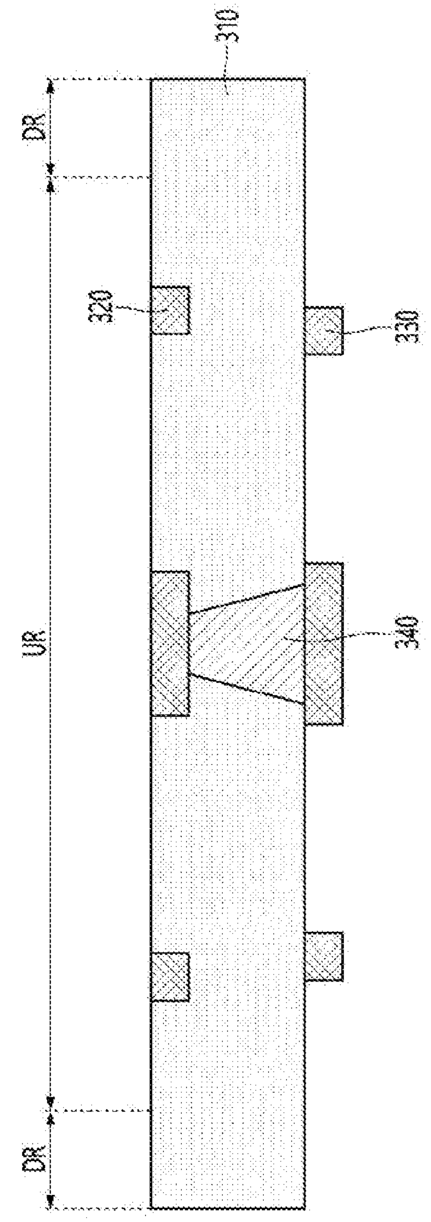

【FIG. 6G】
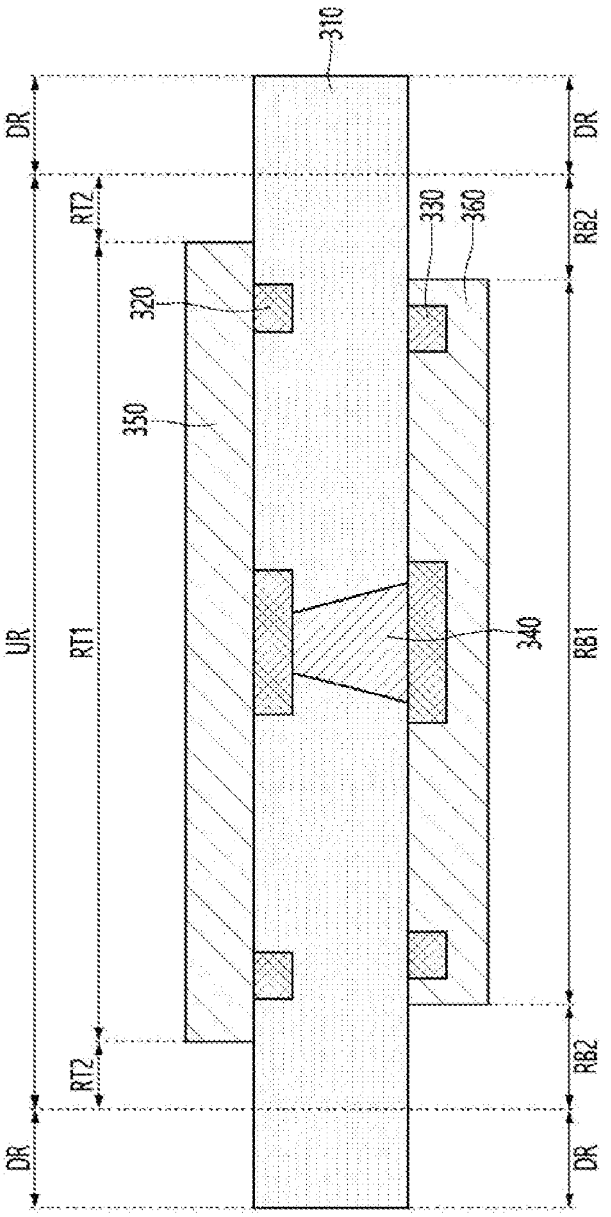

【FIG. 6H】
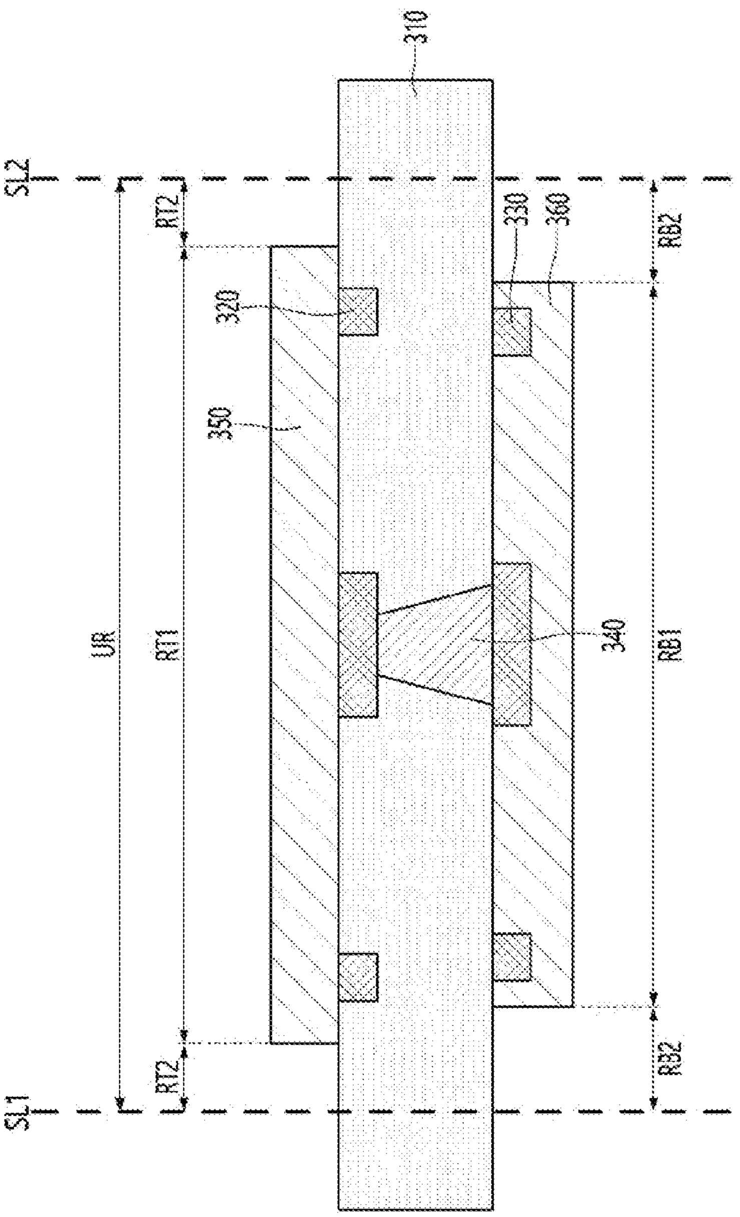

【FIG. 6I】
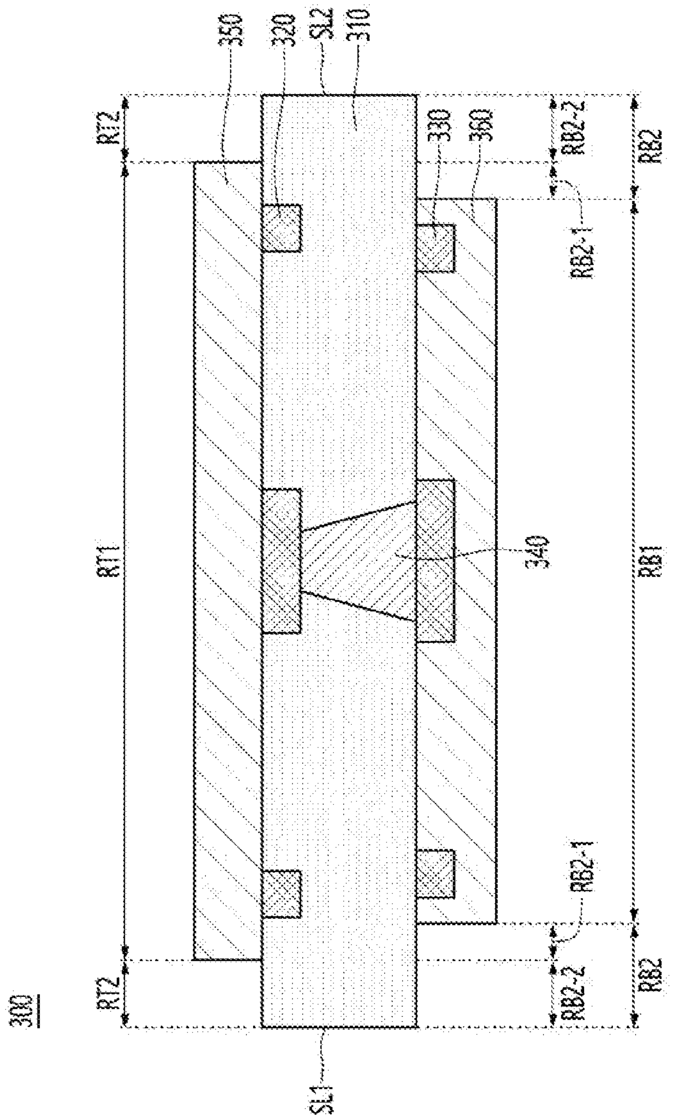

【FIG. 7】
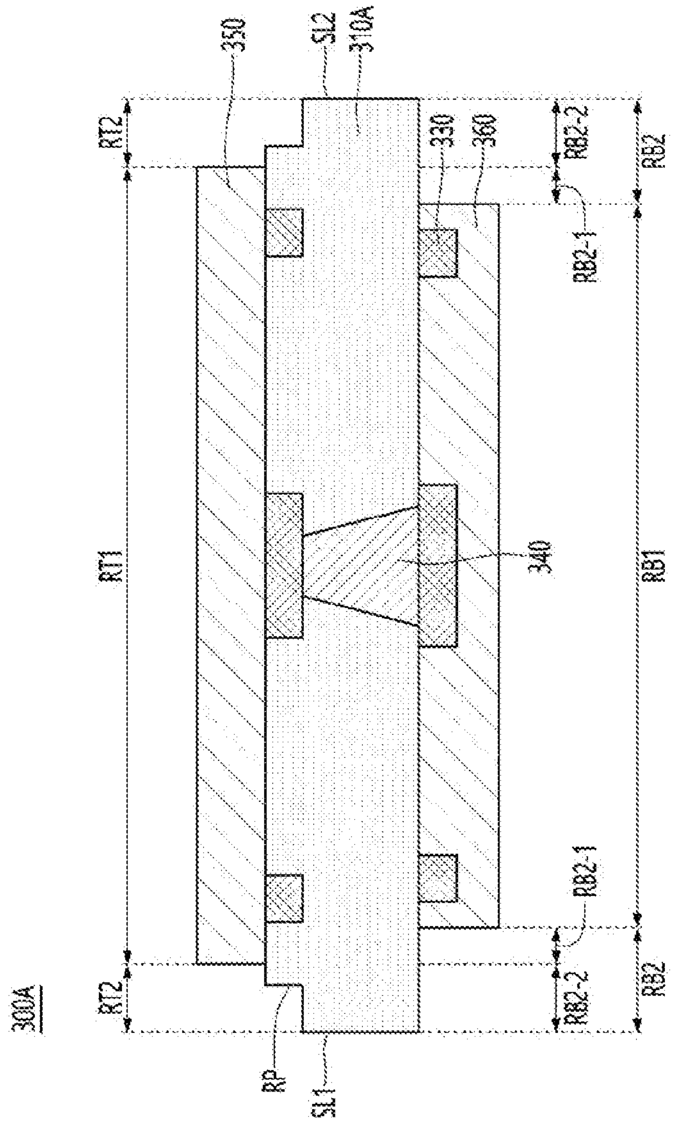

【FIG. 8A】
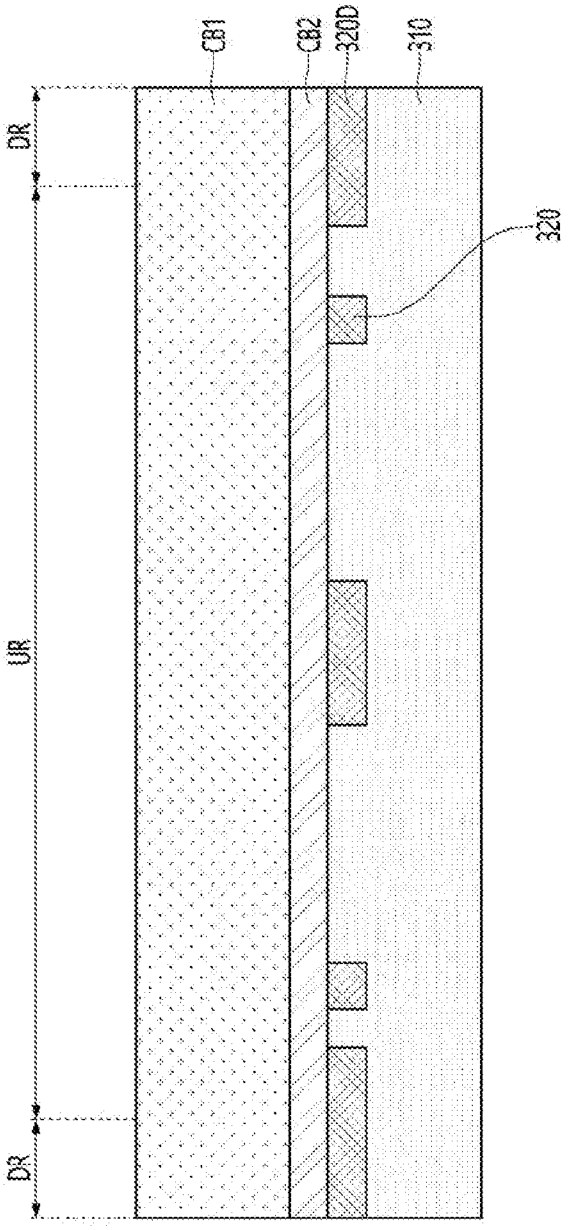

【FIG. 8B】
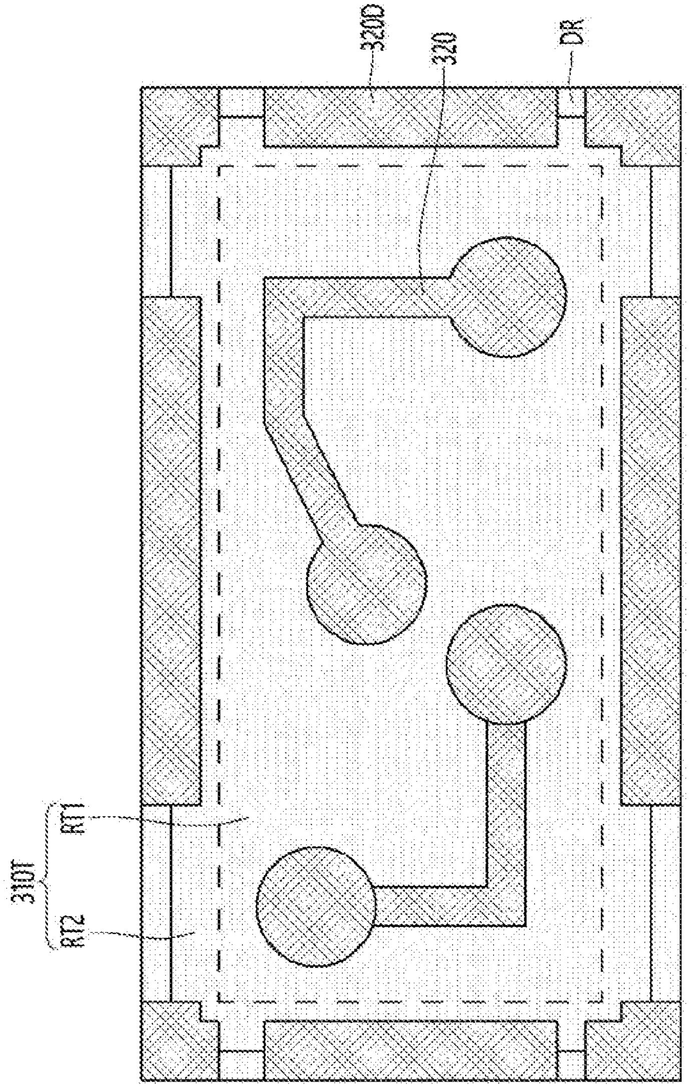

【FIG. 9】
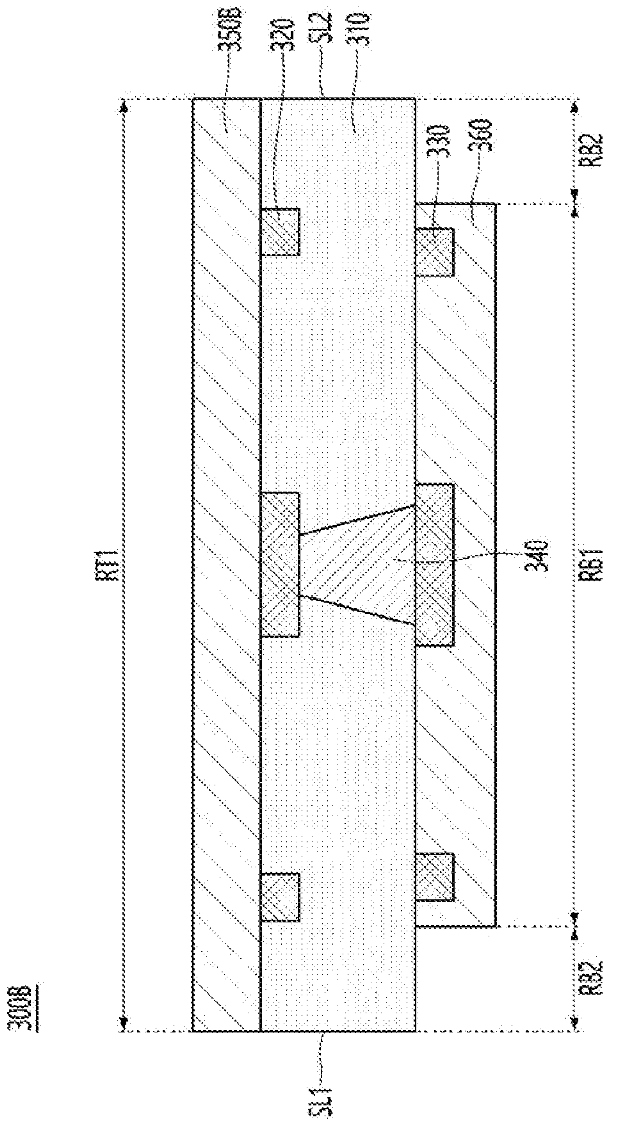

【FIG. 10】
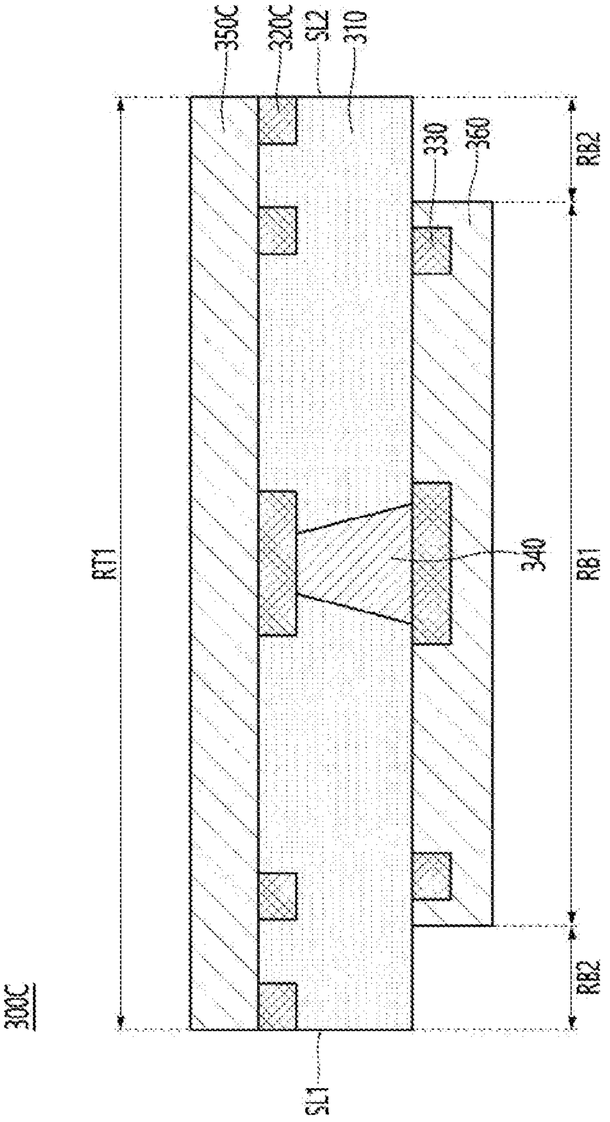

CIRCUIT BOARD AND SEMICONDUCTOR PACKAGE COMPRISING SAME

CROSS REFERENCE TO RELATED APPLICATIONS

This application is the National Phase of PCT International Application No. PCT/KR2022/011381, filed on Aug. 2, 2022, which claims priority under 35 U.S.C. 119(a) to Patent Application No. 10-2021-0101422, filed in the Republic of Korea on Aug. 2, 2021, all of which are hereby expressly incorporated by reference into the present application.

BACKGROUND

Technical Field

The embodiment relates to a circuit board and a semiconductor package comprising the same.

Discussion of the Related Art

As miniaturization, weight reduction, and integration of an electronic component are accelerated, a line width of a circuit has been miniaturized. In particular, as a design rule of a semiconductor chip is integrated on a nanometer scale, a circuit line width of a package substrate or a printed circuit board on which the semiconductor chip is mounted has been miniaturized to several micrometers or less.

Various methods have been proposed in order to increase the degree of circuit integration of the printed circuit board, that is, to reduce the circuit line width. For the purpose of preventing loss of the circuit line width in an etching step for forming a pattern after copper plating, a semi-additive process (SAP) method and a modified semi-additive process (MSAP) have been proposed.

Then, an embedded trace substrate (hereinafter referred to as "ETS") method for embedding a copper foil in an insulating layer in order to implement a fine circuit pattern has been used in the industry. In the ETS method, instead of forming a copper foil circuit on a surface of the insulating layer, the copper foil circuit is manufactured in an embedded form in the insulating layer, and thus there is no circuit loss due to etching and it is advantageous for miniaturizing the circuit pitch.

These circuit boards are heat treated during the circuit board manufacturing process and warpage may occur. In addition, the circuit board is also becoming thinner as an electronic product becomes smaller and thinner. As the circuit board becomes thinner, the defect rate due to warping increases. Here, the causes of warping are diverse, such as differences in a coefficient of thermal expansion (CTE) and elastic modulus of the insulating material and the metal circuit pattern.

Furthermore, the circuit board manufactured by the ETS method as described above is manufactured by performing a sequential stacking process on one side of a carrier member as a center.

Accordingly, the circuit board manufactured by the ETS method has an asymmetric structure in the circuit pattern layers disposed on an uppermost side and a lowermost side.

For example, an uppermost circuit pattern layer has a structure embedded in the insulating layer. Differently, a lowermost circuit pattern layer has a structure that protrudes below the lower surface of the insulating layer.

In addition, in a circuit board having an asymmetric structure as described above, there is a problem in that the degree of warpage occurs more severely. For example, if the embedded pattern is disposed at an upper side in a circuit board having an asymmetric structure as described above, there is a problem that warpage occurs in a crying direction (for example, ∩).

Accordingly, there is a need for a method to minimize warpage of circuit boards manufactured using the ETS method with an asymmetric structure.

SUMMARY

An embodiment provides a circuit board with a structure that minimizes warping and a package substrate including the same.

Additionally, the embodiment provides a circuit board in which an opening ratio of a first protective layer disposed on an insulating layer is different from that of a second protective layer disposed under the insulating layer, and a package substrate including the same.

Additionally, the embodiment provides a circuit board having a structure in which at least a portion of an upper surface of the insulating layer vertically overlaps an opening of the first protective layer, and a package substrate including the same.

Additionally, the embodiment provides a circuit board having a structure in which at least a portion of a lower surface of the insulating layer vertically overlaps an opening of the second protective layer, and a package substrate including the same.

Additionally, the embodiment provides a circuit board in which a width of a first protective layer disposed at the upper surface of the insulating layer and a width of the second protective layer disposed at the lower surface of the insulating layer are different from each other, and a package substrate including the same.

Technical problems to be solved by the proposed embodiments are not limited to the above-mentioned technical problems, and other technical problems not mentioned may be clearly understood by those skilled in the art to which the embodiments proposed from the following descriptions belong.

A circuit board according to an embodiment comprises an insulating layer; a first circuit pattern layer disposed on the insulating layer; a first protective layer disposed on the first circuit pattern layer and having a width narrower than of a width of the insulating layer; a second circuit pattern layer disposed under the insulating layer; and a second protective layer disposed under the second circuit pattern layer and having a width narrower than the width of the insulating layer, wherein a first surface of the insulating layer includes a first region overlapping the first protective layer in a vertical direction, and a second region excluding the first region, wherein a second surface opposite to the first surface of the insulating layer includes a third region overlapping the second protective layer in the vertical direction, and a fourth region excluding the third region, and wherein a portion of the second region overlaps a portion of the fourth region in the vertical direction.

In addition, the second region is a region adjacent to an outermost end of the insulating layer at the first surface of the insulating layer, and the fourth region is a region adjacent to the outermost end of the insulating layer at the second surfaces of the insulating layer.

In addition, the first region is a central region of the first surface of the insulating layer, wherein The second region is an edge region of the first surface of the insulating layer, wherein the third region is a central region of the second surface of the insulating layer, and wherein the fourth region is an edge region of the second surface of the insulating layer.

In addition, the fourth region includes a fourth-first region overlapping the first region in the vertical direction, and a fourth-second region excluding the fourth-first region.

In addition, the second region overlaps the fourth-second region in the vertical direction.

In addition, the second region of the insulating layer includes a recess that is concave toward the second surface of the insulating layer.

In addition, a width of the recess is same as a width of the first circuit pattern layer.

In addition, at least a portion of the first circuit pattern layer is embedded in the insulating layer.

In addition, the second circuit pattern layer protrudes below the second surface of the insulating layer.

In addition, at least a portion of an upper surface of the first circuit pattern layer overlaps the first protective layer in the vertical direction, and wherein at least a portion of a side surface of the first circuit pattern layer is covered with the insulating layer.

Meanwhile, the circuit board according to the embodiment comprises an insulating layer; a first circuit pattern layer disposed on the insulating layer; a first protective layer disposed on the insulating layer and the first circuit pattern layer; a second circuit pattern layer disposed under the insulating layer; and a second protective layer disposed under the insulating layer and the second circuit pattern layer, wherein the lower surface of the insulating layer includes a first lower region overlapping the second protective layer in a vertical direction, and a second lower region adjacent to the outermost end of the insulating layer and excluding the first lower region, and the second lower region overlaps the first protective layer in the vertical direction.

In addition, the second lower region is an edge region closest to the outermost end of the insulating layer at the lower surface of the insulating layer.

In addition, at least one of the first circuit pattern layers vertically overlaps the second lower region.

In addition, a side surface of the first circuit pattern layer overlapping the second lower region in the vertical direction is located on a same vertical line as an outermost end of the insulating layer.

In addition, at least a portion of the first circuit pattern layer is embedded in the insulating layer, and the second circuit pattern layer protrudes below the lower surface of the insulating layer.

In addition, at least a portion of the upper surface of the first circuit pattern layer overlaps the first protective layer in the vertical direction, and at least a portion of the side surface of the first circuit pattern layer is covered with the insulating layer.

Advantageous Effects

The circuit board in the embodiment may have improved warpage characteristics.

Specifically, the circuit board includes a first protective layer disposed on the upper surface of the insulating layer and a second protective layer disposed on the lower surface of the insulating layer. Additionally, the upper surface of the insulating layer includes a first upper region that overlaps the first protective layer in a vertical direction and a second upper region excluding the first upper region. Correspondingly, the lower surface of the insulating layer includes a first lower region vertically overlapping with the second protective layer and a second lower region excluding the first lower region. At this time, at least a portion of the second upper region may overlap in a vertical direction with at least a portion of the second lower region. Furthermore, the second upper region is an edge region adjacent to the outermost end of the insulating layer at the upper surfaces of the insulating layer, and the second lower region is an edge region adjacent to the outermost end of the insulating layer at the lower surface of the insulating layer. Accordingly, the embodiment can reduce shrinkage due to curing of the first protective layer and the second protective layer in the edge region of the insulating layer, and thus improve the warpage characteristics of the circuit board.

Furthermore, in the embodiment, the second lower region of the insulating layer includes a second-first region that overlaps a first upper region of the insulating layer, and a second-second region excluding the second-first region. That is, a volume of the second protective layer in the embodiment may be as small as an area of the second-second region compared to a volume of the first protective layer. Accordingly, a curing shrinkage rate in the second upper region of the insulating layer due to the first protective layer may be greater than a curing shrinkage rate in the second lower region of the insulating layer due to the second protective layer. Accordingly, the circuit board in the embodiment may be bent upward due to curing shrinkage caused by the first protective layer. At this time, the circuit board in the general ETS structure is bent in a crying direction corresponding to a lower direction. Accordingly, the embodiment can suppress the generation of warpage in the crying direction or shift the warpage direction of the circuit board to the smile direction, thereby improving the warpage characteristics of the circuit board.

BRIEF DESCRIPTION OF THE DRAWINGS

FIG. 1 is a view showing a circuit board of a comparative example.

FIG. 2A is a cross-sectional view illustrating a semiconductor package according to a first embodiment.

FIG. 2B is a cross-sectional view illustrating a semiconductor package according to a second embodiment.

FIG. 2C is a cross-sectional view illustrating a semiconductor package according to a third embodiment.

FIG. 2D is a cross-sectional view illustrating a semiconductor package according to a fourth embodiment.

FIG. 2E is a cross-sectional view illustrating a semiconductor package according to a fifth embodiment.

FIG. 2F is a cross-sectional view illustrating a semiconductor package according to a sixth embodiment.

FIG. 2G is a cross-sectional view illustrating a semiconductor package according to a seventh embodiment.

FIG. 3A is a view showing a panel for manufacturing a circuit board according to an embodiment.

FIG. 3B is a view for explaining a process for manufacturing a circuit board in a panel unit of FIG. 3A.

FIG. 4 is a cross-sectional view of a circuit board according to a first embodiment.

FIG. 5A is a plan view of the circuit board of FIG. 4 viewed from a top.

FIG. 5B is a plan view of the circuit board of FIG. 4 viewed from a bottom.

FIGS. 6A to 6I are views for explaining a method for manufacturing a circuit board according to a first embodiment in order of processes.

FIG. 7 is a view showing a circuit board according to a second embodiment.

FIGS. 8A and 8B are diagrams for explaining a structure of FIG. 7.

FIG. 9 is a view showing a circuit board according to a third embodiment.

FIG. 10 is a view showing a circuit board according to a fourth embodiment.

DETAILED DESCRIPTION OF THE EMBODIMENTS

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, it will be understood that there are no intervening elements present.

As used herein, a singular expression includes a plural expression, unless the context clearly indicates otherwise.

It will be understood that the terms "comprise", "include", or "have" specify the presence of stated features, integers, steps, operations, elements, components and/or groups thereof disclosed in the present specification, but do not preclude the possibility of the presence or addition of one or more other features, integers, steps, operations, elements, components, and/or groups thereof.

Hereinafter, a comparative example will be described before describing embodiments of a present invention with reference to attached drawings.

FIG. 1 is a diagram showing a circuit board of a comparative example.

Referring to (a) of FIG. 1, in the comparative example, a circuit board is manufactured using an ETS (Embedded Trace Substrate) method to refine the circuit pattern.

The ETS method has a structure in which a fine pattern is embedded in an insulating layer, thereby enabling stable protection of the fine pattern. In addition, the ETS method uses a seed layer to form a circuit pattern through electrolytic plating instead of forming a circuit pattern by etching the copper foil layer, so that there is no change in the shape of the circuit pattern due to etching, and the circuit pattern can be refined.

The ETS method in the comparative example is performed by performing a plating process on one side of the carrier board or support member to form a fine circuit pattern.

For example, the circuit board 1 of the comparative example includes an insulating layer 10, a first circuit pattern layer 20, a second circuit pattern layer 30, a first protective layer 40, and a second protective layer 50.

The first circuit pattern layer 20 is disposed on an upper surface of the insulating layer 10. For example, the first circuit pattern layer 20 is embedded within the insulating layer 10. That is, the side and lower surfaces of the first circuit pattern layer 20 may be covered by the insulating layer 10.

The second circuit pattern layer 30 is disposed on a lower surface of the insulating layer 10. For example, the second circuit pattern layer 30 protrudes below the lower surface of the insulating layer 10.

A through electrode 60 is disposed within the insulating layer 10. The through electrode 60 penetrates the insulating layer 10. The through electrode 60 may connect the first circuit pattern layer 20 disposed on the upper surface of the insulating layer 10 and the second circuit pattern layer 30 disposed on the lower surface of the insulating layer 10.

A first protective layer 40 is disposed on an upper surface of the insulating layer 10 and an upper surface of the first circuit pattern layer 20. The first protective layer 40 may be a solder resist.

A second protective layer 50 is disposed on a lower surface of the insulating layer 10 and a lower surface of the second circuit pattern layer 30. The second protective layer 50 may be a solder resist.

At this time, the circuit board 1 manufactured by the ETS method as described above has a problem in that its warpage characteristics are deteriorated due to an asymmetric structure of the first circuit pattern layer 20 and the second circuit pattern layer 30.

In addition, the decline in the bending characteristics of the circuit board 1 as described above causes reliability problems in the process of manufacturing the circuit board, and furthermore, after the manufacturing of the circuit board is completed, there is a problem that the flatness of the product is deteriorated during the assembly process or the warpage characteristics are deteriorated during the high temperature assembly process.

For example, as shown in (b) of FIG. 1, the circuit board of the ETS structure generates a convex crying warpage in a direction in which the first circuit pattern layer 20, which is an embedded pattern, is disposed, and this causes various reliability problems as described above.

—Electronic Device—

Before describing the embodiment, an electronic device to which the semiconductor package of the embodiment is applied will be briefly described. The electronic device includes a main board (not shown). The main board may be physically and/or electrically connected to various components. For example, the main board may be connected to the semiconductor package of the embodiment. Various semiconductor devices may be mounted on the semiconductor package.

The semiconductor device may include an active device and/or a passive device. The active device may be a semiconductor chip in the form of an integrated circuit (IC) in which hundreds to millions of devices are integrated in one chip. The semiconductor device may be a logic chip, a memory chip, or the like. The logic chip may be a central processor (CPU), a graphics processor (GPU), or the like. For example, the logic chip may be an application processor (AP) chip including at least one of a central processor (CPU), a graphics processor (GPU), a digital signal processor, a cryptographic processor, a microprocessor and a microcontroller, or an analog-digital converter, an application-specific IC (ASIC), or the like, or a chip set comprising a specific combination of those listed so far.

The memory chip may be a stack memory such as HBM. The memory chip may also include a memory chip such as volatile memory (e.g., DRAM), non-volatile memory (e.g., ROM), flash memory, and the like.

On the other hand, a product group to which the semiconductor package of the embodiment is applied may be any one of CSP (Chip Scale Package), FC-CSP (Flip Chip-Chip Scale Package), FC-BGA (Flip Chip Ball Grid Array), POP (Package on Package) and SIP (System in Package), but is not limited thereto.

In addition, the electronic device may be a smart phone, a personal digital assistant, a digital video camera, a digital still camera, a vehicle, a high-performance server, a network system, computer, monitor, tablet, laptop, netbook, television, video game, smart watch, automotive, or the like. However, the embodiment is not limited thereto, and may be any other electronic device that processes data in addition to these.

Hereinafter, a semiconductor package including a circuit board according to an embodiment will be described. The semiconductor package of the embodiment may have various package structures including a circuit board to be described later. In addition, the circuit board in one embodiment may be a package substrate described below, and the circuit board in another embodiment may be an interposer described below.

FIG. 2A is a cross-sectional view illustrating a semiconductor package according to a first embodiment, FIG. 2B is a cross-sectional view illustrating a semiconductor package according to a second embodiment, FIG. 2C is a cross-sectional view illustrating a semiconductor package according to a third embodiment, FIG. 2D is a cross-sectional view illustrating a semiconductor package according to a fourth embodiment, FIG. 2E is a cross-sectional view illustrating a semiconductor package according to a fifth embodiment, FIG. 2F is a cross-sectional view illustrating a semiconductor package according to a sixth embodiment, and FIG. 2G is a cross-sectional view illustrating a semiconductor package according to a seventh embodiment.

Referring to FIG. 2A, the semiconductor package according to the first embodiment may include a first circuit board 1100, a second circuit board 1200, and a semiconductor device 1300.

The first circuit board 1100 means a package substrate.

For example, the first circuit board 1100 may provide a space to which at least one external substrate is coupled. The external substrate may refer to a second circuit board 1200 coupled to the first circuit board 1100. Also, the external substrate may refer to a main board included in an electronic device coupled to a lower portion of the first circuit board 1100.

Also, although not shown in the drawing, the first circuit board 1100 may provide a space in which at least one semiconductor device is mounted.

The first circuit board 1100 includes at least one insulating layer, an electrode disposed on the at least one insulating layer, and a through portion passing through the at least one insulating layer.

A second circuit board 1200 is disposed on the first circuit board 1100.

The second circuit board 1200 may be an interposer. For example, the second circuit board 1200 may provide a space in which at least one semiconductor device is mounted. The second circuit board 1200 may be connected to the at least one semiconductor device 1300. For example, the second circuit board 1200 may provide a space in which the first semiconductor device 1310 and the second semiconductor device 1320 are mounted. The second circuit board 1200 may electrically connect the first and second semiconductor devices 1310 and 1320 and the first circuit board 1100 while electrically connecting the first semiconductor device 1310 and the second semiconductor device 1320. That is, the second circuit board 1200 may perform a horizontal connection function between a plurality of semiconductor devices and a vertical connection function between the semiconductor devices and the package substrate.

FIG. 2 illustrates that the first and second semiconductor devices 1310 and 1320 are disposed on the second circuit board 1200, but is not limited thereto. For example, one semiconductor device may be disposed on the second circuit board 1200, or alternatively, three or more semiconductor devices may be disposed.

The second circuit board 1200 may be disposed between the semiconductor device 1300 and the first circuit board 1100.

In an embodiment, the second circuit board 1200 may be an active interposer that functions as a semiconductor device. When the second circuit board 1200 functions as a semiconductor device, the package of the embodiment may have a structure in which a plurality of logic chips are mounted on the first circuit board 1100 in a vertically stacked structure. In addition, a first logic chip corresponding to the active interposer among the logic chips may perform a signal transfer function between the second logic chip disposed thereon and the first circuit board 1100 while functioning as a corresponding logic chip.

According to another embodiment, the second circuit board 1200 may be a passive interposer. For example, the second circuit board 1200 may function as a signal relay between the semiconductor device 1300 and the first circuit board 1100. For example, a number of terminals of the semiconductor device 1300 is gradually increasing due to 5G, Internet of Things (IoT), increased image quality, and increased communication speed. That is, the number of terminals provided in the semiconductor device 1300 increases, thereby reducing the width of the terminals or an interval between the plurality of terminals. In this case, the first circuit board 1100 is connected to the main board of the electronic device. There is a problem in that the thickness of the first circuit board 1100 increases or the layer structure of the first circuit board 1100 becomes complicated in order for the electrodes provided on the first circuit board 1100 to have a width and an interval to be respectively connected to the semiconductor device 1300 and the main board. Accordingly, in the first embodiment, the second circuit board 1200 is disposed on the first circuit board 1100 and the semiconductor device 1300. In addition, the second circuit board 1200 may include electrodes having a fine width and an interval corresponding to the terminals of the semiconductor device 1300.

the semiconductor device 1300 may be an application processor (AP) chip including at least one of a central processor (CPU), a graphics processor (GPU), a digital signal processor, a cryptographic processor, a microprocessor and a microcontroller, or an analog-digital converter, an application-specific IC (ASIC), or the like, or a chip set comprising a specific combination of those listed so far. The memory chip may be a stack memory such as HBM. The memory chip may also include a memory chip such as volatile memory (e.g., DRAM), non-volatile memory (e.g., ROM), flash memory, and the like.

Meanwhile, the semiconductor package of the first embodiment may include a connection portion.

For example, the semiconductor package includes a first connection portion 1410 disposed between the first circuit board 1100 and the second circuit board 1200. The first connection portion 1410 electrically connects the second circuit board 1200 to the first circuit board 1100 while coupling them.

For example, the semiconductor package may include the second connection portion 1420 disposed between the second circuit board 1200 and the semiconductor device 1300. The second connection portion 1420 may electrically connect the semiconductor device 1300 to the second circuit board 1200 while coupling them.

The semiconductor package includes a third connection portion 1430 disposed on a lower surface of the first circuit board 1100. The third connection portion 1430 may electrically connect the first circuit board 1100 to the main board while coupling them.

At this time, the first connection portion 1410, the second connection portion 1420, and the third connection portion 1430 may electrically connect between the plurality of components by using at least one bonding method of wire bonding, solder bonding and metal-to-metal direct bonding.

That is, since the first connection portion 1410, the second connection portion 1420, and the third connection portion 1430 have a function of electrically connecting a plurality of components, when the metal-to-metal direct bonding is used, the connection portion of the semiconductor package may be understood as an electrically connected portion, not a solder or wire.

The wire bonding method may refer to electrically connecting a plurality of components using a conductive wire such as gold (Au). Also, the solder bonding method may electrically connect a plurality of components using a material containing at least one of Sn, Ag, and Cu. In addition, the metal-to-metal direct bonding method may refer to recrystallization by applying heat and pressure between a plurality of components without the presence of solder, wire, conductive adhesive, etc. and to directly bond between the plurality of components. In addition, the metal-to-metal direct bonding method may refer to a bonding method by the second connection portion 1420. In this case, the second connection portion 1420 may mean a metal layer formed between a plurality of components by the recrystallization.

Specifically, the first connection portion 1410, the second connection portion 1420, and the third connection portion 1430 may couple a plurality of components to each other by a thermal compression (TC) bonding method. The TC bonding may refer to a method of directly coupling a plurality of components by applying heat and pressure to the first connection portion 1410, the second connection portion 1420, and the third connection portion 1430.

In this case, at least one of the first circuit board 1100 and the second circuit board 1200 may include a protrusion provided in the electrode on the first connection portion 1410, the second connection portion 1420, and the third connection portion 1430 are disposed. The protrusion may protrude outward from the first circuit board 1100 or the second circuit board 1200.

The protrusion may be referred to as a bump. The protrusion may also be referred to as a post. The protrusion may also be referred to as a pillar. Preferably, the protrusion may refer to an electrode on which a second connection portion 1420 for coupling with the semiconductor device 1300 is disposed among the electrodes of the second circuit board 1200. That is, as a pitch of the terminals of the semiconductor device 1300 is reduced, a short circuit may occur in the second connection portions 1420 respectively connected to the terminals of the semiconductor device 1300. Accordingly, in the embodiment, the protrusion is included in the electrode of the second circuit board 1200 on which the second connection portion 1420 is disposed in order to reduce a volume of the second connection portion 1420. The protrusion may improve matching between the electrode of the second circuit board 1200 and the terminal of the semiconductor device 1300 and prevent diffusion of the second connection portion 1420.

Meanwhile, referring to FIG. 2B, the semiconductor package of the second embodiment is different from the semiconductor package of the first embodiment in that the connecting member 1210 is disposed on the second circuit board 1200. The connecting member 1210 may be referred to as a bridge substrate. For example, the connecting member 1210 may include a redistribution layer.

In an embodiment, the connecting member 1210 may be a silicon bridge. That is, the connecting member 1210 may include a silicon substrate and a redistribution layer disposed on the silicon substrate.

In another embodiment, the connecting member 1210 may be an organic bridge. For example, the connecting member 1210 may include an organic material. For example, the connecting member 1210 includes an organic substrate including an organic material instead of the silicon substrate.

The connecting member 1210 may be embedded in the second circuit board 1200, but is not limited thereto. For example, the connecting member 1210 may be disposed on the second circuit board 1200 to have a protruding structure.

Also, the second circuit board 1200 may include a cavity, and the connecting member 1210 may be disposed in the cavity of the second circuit board 1200.

The connecting member 1210 may horizontally connect a plurality of semiconductor devices disposed on the second circuit board 1200.

Referring to FIG. 2C, the semiconductor package according to the third embodiment includes a second circuit board 1200 and a semiconductor device 1300. In this case, the semiconductor package of the third embodiment has a structure in which the first circuit board 1100 is removed compared to the semiconductor package of the second embodiment.

That is, the second circuit board 1200 of the third embodiment may function as a package substrate while performing an interposer function.

The first connection portion 1410 disposed on the lower surface of the second circuit board 1200 may couple the second circuit board 1200 to the main board of the electronic device.

Referring to FIG. 2D, the semiconductor package according to the fourth embodiment includes a first circuit board 1100 and a semiconductor device 1300.

In this case, the semiconductor package of the fourth embodiment has a structure in which the second circuit board 1200 is removed compared to the semiconductor package of the second embodiment.

That is, the first circuit board 1100 of the fourth embodiment may function as an interposer connecting the semiconductor device 1300 and the main board while functioning as a package substrate. To this end, the first circuit board 1100 may include a connecting member 1110 for connecting the plurality of semiconductor devices. The connecting member 1110 may be a silicon bridge or an organic material bridge connecting a plurality of semiconductor devices.

Referring to FIG. 2E, the semiconductor package of the fifth embodiment further includes a third semiconductor device 1330 compared to the semiconductor package of the fourth embodiment.

To this end, a fourth connection portion 1440 is disposed on the lower surface of the first circuit board 1100.

In addition, a third semiconductor device 1330 may be disposed on the fourth connection portion 1400. That is, the semiconductor package of the fifth embodiment may have a structure in which semiconductor devices are mounted on upper and lower sides, respectively.

In this case, the third semiconductor device 1330 may have a structure disposed on the lower surface of the second circuit board 1200 in the semiconductor package of FIG. 2C.

Referring to FIG. 2F, the semiconductor package according to the sixth embodiment includes a first circuit board 1100.

A first semiconductor device 1310 may be disposed on the first circuit board 1100. To this end, a first connection portion 1410 is disposed between the first circuit board 1100 and the first semiconductor device 1310.

In addition, the first circuit board 1100 includes a conductive coupling portion 1450. The conductive coupling portion 1450 may further protrude from the first circuit board 1100 toward the second semiconductor device 1320. The conductive coupling portion 1450 may be referred to as a bump or, alternatively, may also be referred to as a post. The conductive coupling portion 1450 may be disposed to have a protruding structure on an electrode disposed on an uppermost side of the first circuit board 1100.

A second semiconductor device 1320 is disposed on the conductive coupling portion 1450 of the first circuit board 1100. In this case, the second semiconductor device 1320 may be connected to the first circuit board 1100 through the conductive coupling portion 1450. In addition, a second connection portion 1420 may be disposed on the first semiconductor device 1310 and the second semiconductor device 1320.

Accordingly, the second semiconductor device 1320 may be electrically connected to the first semiconductor device 1310 through the second connection portion 1420.

That is, the second semiconductor device 1320 is connected to the first circuit board 1100 through the conductive coupling portion 1450, and is also connected to the first semiconductor device 1310 through the second connection portion 1420.

In this case, the second semiconductor device 1320 may receive a power signal through the conductive coupling portion 1450. Also, the second semiconductor device 1320 may transmit and receive a communication signal to and from the first semiconductor device 1310 through the second connection portion 1420.

The semiconductor package according to the sixth embodiment provides a power signal to the second semiconductor device 1320 through the conductive coupling portion 1450, thereby providing sufficient power for driving the second semiconductor device 1320. Accordingly, the embodiment may improve the driving characteristics of the second semiconductor device 1320. That is, the embodiment may solve the problem of insufficient power provided to the second semiconductor device 1320. Furthermore, in the embodiment, the power signal and the communication signal of the second semiconductor device 1320 are provided through different paths through the conductive coupling portion 1450 and the second connection portion 1420. Through this, the embodiment can solve the problem that the communication signal is lost due to the power signal. For example, the embodiment may minimize mutual interference between communication signals of power signals. Meanwhile, the second semiconductor device 1320 according to the sixth embodiment may have a POP structure and be disposed on the first circuit board 1100. For example, the second semiconductor device 1320 may be a memory package including a memory chip. In addition, the memory package may be coupled on the conductive coupling portion 1450. In this case, the memory package may not be connected to the first semiconductor device 1310.

Referring to FIG. 2G, the semiconductor package according to the seventh embodiment includes a first circuit board 1100, a first connection portion 1410, a first connection portion 1410, a semiconductor device 1300, and a third connection portion 1430.

In this case, the semiconductor package of the seventh embodiment is different from the semiconductor package of the fourth embodiment in that the first circuit board 1100 includes a plurality of substrate layers while the connecting member 1110 is removed.

The first circuit board 1100 includes a plurality of substrate layers. For example, the first circuit board 1100 may include a first substrate layer 1100A corresponding to a package substrate and a second substrate layer 1100B corresponding to a redistribution layer of the connecting member.

That is, in the first circuit board 1100, a second substrate layer 1100B corresponding to a redistribution layer is disposed on the first substrate layer 1100A.

In other words, the semiconductor package of the seventh embodiment includes the first substrate layer 1100A and the second substrate layer 1100B integrally formed. The material of the insulating layer of the second substrate layer 1100B may be different from the material of the insulating layer of the first substrate layer 1100A. For example, the material of the insulating layer of the second substrate layer 1100B may include a photocurable material. For example, the second substrate layer 1100B may be a photo imageable dielectric (PID). In addition, since the second substrate layer 1100B includes a photocurable material, it is possible to miniaturize the electrode. Accordingly, in the seventh embodiment, the second substrate layer 11001B may be formed by sequentially stacking an insulating layer of a photo-curable material on the first substrate layer 1100A and forming a miniaturized electrode on the insulating layer of the photo-curable material. Through this, the second substrate 1100B may be a redistribution layer including a miniaturized electrode.

Hereinafter, the circuit board of the embodiment will be described.

Before describing the circuit board of the embodiment, the circuit board described below may mean any one of a plurality of circuit boards included in the previous semiconductor package.

For example, in an embodiment, a circuit board described below may refer to the first circuit board 1100, the second circuit board 1200, and the connecting member (or bridge substrate, 1110 and 1210) shown in any one of FIGS. 2A to 2G.

The circuit board of the embodiment may be manufactured on a panel unit.

FIG. 3A is a view showing a panel for manufacturing a circuit board according to an embodiment, and FIG. 3B is a view for explaining a process for manufacturing a circuit board in a panel unit of FIG. 3A.

Referring to FIGS. 3A and 3B, the circuit board is manufactured in a panel unit.

Additionally, a process of mounting devices or a process of molding devices on a circuit board manufactured in the panel unit is performed in units of strips constituting the panel.

Then, when manufacturing of the circuit board in strip units is completed, each of a plurality of units constituting the strip can be sawed.

Specifically, referring to FIG. 3A, a basic material for manufacturing a general circuit board may be a panel 100 in the form of a copper clad laminate (CCL).

A width of the panel 100 in a width direction may be 415 mm to 430 mm. Additionally, a longitudinal width of the panel 100 may be 510 mm to 550 mm. Here, the width in the width direction of the panel 100 may be a width in a minor axis direction, and the width in the longitudinal direction may be a width in a major axis direction.

At this time, the panel 100 may be divided into a plurality of strips 200. In other words, the panel 100 may be composed of a set of a plurality of strips 200. The plurality of strips 200 may be spaced apart from each other at regular intervals in the width and longitudinal directions within the panel 100. For example, one panel 100 may be divided into 16 strips 200. That is, one panel 100 can be divided into two regions in the width direction and eight regions in the longitudinal direction.

Meanwhile, each strip 200 may include a plurality of units 300. For example, one strip 200 may include 1,275 units 300, but is not limited thereto. For example, the number of units 300 included in one strip 200 may decrease or increase depending on process capability.

At this time, each unit 300 may have a width in the width direction of approximately 3 mm and a width in the longitudinal direction may be approximately 2 mm. Meanwhile, each unit 300 may refer to a circuit board in an embodiment.

In other words, one strip 200 includes 1,275 units 300, and the panel 100 includes 16 strips 200. Accordingly, one panel 100 may include 16 strips 200 and 20,400 units 300.

For example, when manufacturing circuit boards in units of panels 100 as shown in FIG. 2A, 20,400 circuit boards can be manufactured simultaneously.

In addition, when manufacturing a circuit board in units of the panel 100, as shown in FIG. 2*b*, each strip 200 is divided into unit regions 300A, 300B, 300C, and 300D where the unit 300 is disposed, and a dummy region DR between the base unit regions 300A, 300B, 300C and 300D. In addition, when manufacturing for each unit is completed, a process of sawing each unit region 300A, 300B, 300C and 300D in the dummy region DR is performed based on a sawing line SL that separates each unit region 300A, 300B, 300C and 300D.

For example, one unit manufacturing in the strip 200 unit is completed based on the circuit board of one unit region 300A, sawing is performed based on the sawing lines SL1 and SL2 surrounding the unit region 300A, so that the circuit board corresponding to each unit region can be separated from the strip 200.

At this time, the embodiment allows an opening of a protective layer such as solder resist to be located in a unit region adjacent to the sawing lines SL1 and SL2 during the process of manufacturing the circuit board. Preferably, the embodiment allows for a protective layer to be provided including an opening that overlaps in a vertical direction with at least one of upper and lower surfaces of an insulating layer in the unit region adjacent to the sawing lines SL1 and SL2.

Furthermore, the embodiment allows the size of the opening of the protective layer disposed on the upper surface of the insulating layer to be different from the size of the opening of the protective layer disposed on the lower surface of the insulating layer, thereby improving the warpage characteristics of the circuit board. For example, the embodiment allows the warpage characteristics to be improved by shifting warpage from occurring in the crying direction (e.g., ∩) to the smiling direction (e.g., ∪) as in the comparative example.

For example, when warpage in the crying direction occurs as described above, the embodiment controls the degree of shrinkage of the circuit board due to curing of a protective layer such as solder resist disposed above and below the insulating layer, and allows this to be shifted in the smile direction.

To this end, embodiments can be achieved by adjusting a volume of the protective layer disposed bellow of the insulating layer. For example, a protective layer is not disposed on a region adjacent to the sawing line SL1 and SL2 of the lower surface of the insulating layer, thereby minimizing curing shrinkage in the region adjacent to the sawing line, and accordingly, the circuit board is bent in the smile direction.

This will be explained in more detail below.

Circuit Board of the First Embodiment

FIG. 4 is a cross-sectional view of a circuit board according to a first embodiment, FIG. 5A is a plan view of the circuit board of FIG. 4 viewed from a top, and FIG. 5B is a plan view of the circuit board of FIG. 4 viewed from a bottom.

Preferably, FIG. 4 is a cross-sectional view in a direction B-B' of the circuit board included in one unit region in FIG. 3B. FIG. 5A is a plan view of the circuit board in FIG. 4 with the first protective layer removed, viewed from above. FIG. 5B is a plan view of the circuit board in FIG. 4 with the second protective layer removed, viewed from the bottom.

Hereinafter, a circuit board according to an embodiment will be described in detail with reference to FIGS. 4, 5A, and 5B.

The circuit board of the embodiment provides a mounting space that allows at least one chip to be mounted. The number of chips mounted on the circuit board of the embodiment may be one, alternatively, there may be two, and alternatively, there may be three or more. For example, one processor chip may be mounted on a circuit board, or at least two processor chips performing different functions may be mounted, or one memory chip may be mounted along with one processor chip, or at least two processor chips and at least one memory chip performing different functions may be mounted.

The circuit board includes an insulating layer 310. The insulating layer 310 has a structure of at least one layer. At this time, in FIG. 4, the circuit board is shown as having a one-layer structure based on the number of layers of the insulating layer 310, but the circuit board is not limited to this. For example, the circuit board may have a laminated structure of two or more layers based on the number of layers of the insulating layer 310.

However, for convenience of explanation, the embodiment will be described assuming that the circuit board consists of one layer based on the number of layers of the insulating layer.

On the other hand, if the circuit board has a plurality of layer structure based on the number of layers of the insulating layer, an upper surface of an insulating layer 310 described below may refer to an upper surface of the insulating layer disposed at an uppermost side of the circuit board. In addition, if the circuit board has a multiple layer structure based on the number of layers of the insulating layer, a lower surface of an insulating layer 310 described below may refer to a lower surface of an insulating layer disposed at a lowermost side of the circuit board. In addition, if the circuit board has a multiple layer structure based on the number of layers of the insulating layer, a first circuit pattern layer 320 described below may refer to an uppermost circuit pattern layer disposed on an uppermost insulating layer. In addition, if the circuit board has a multiple layer structure based on the number of layers of the insulating layer, a second circuit pattern layer 330 described below may refer to a lowermost circuit pattern layer disposed on ae lower surface of a lowermost insulating layer.

The insulating layer 310 may include prepreg (PPG). The prepreg may be formed by impregnating a fiber layer in the form of a fabric sheet, such as a glass fabric woven with glass yarn, with an epoxy resin, and then performing thermocompression. However, the embodiment is not limited thereto, and the prepreg constituting the insulating layer 310 may include a fiber layer in the form of a fabric sheet woven with carbon fiber yarn.

Specifically, the insulating layer 310 may include a resin and a reinforcing fiber disposed in the resin. The resin may be an epoxy resin, but is not limited thereto. The resin is not particularly limited to the epoxy resin, and for example, one or more epoxy groups may be included in the molecule, or alternatively, two or more epoxy groups may be included, or alternatively, four or more epoxy groups may be included. In addition, the resin of the insulating layer 310 may include a naphthalene group, for example, may be an aromatic amine type, but is not limited thereto. For example, the resin may be include a bisphenol A type epoxy resin, a bisphenol F type epoxy resin, a bisphenol S type epoxy resin, a phenol novolac type epoxy resin, an alkylphenol novolac type epoxy resin, a biphenyl type epoxy resin, an aralkyl type epoxy resin, dicyclopentadiene type epoxy resin, naphthalene type epoxy resin, naphthol type epoxy resin, epoxy resin of condensate of phenol and aromatic aldehyde having phenolic hydroxyl group, biphenyl aralkyl type epoxy resin, fluorene type epoxy resin resins, xanthene-type epoxy resins, triglycidyl isocyanurate, rubber-modified epoxy resins, phosphorous-based epoxy resins, and the like, and naphthalene-based epoxy resins, bisphenol A-type epoxy resins, and phenol novolac epoxy resins, cresol novolak epoxy resins, rubber-modified epoxy resins, and phosphorous-based epoxy resins. In addition, the reinforcing fiber may include glass fiber, carbon fiber, aramid fiber (eg, aramid-based organic material), nylon, silica-based inorganic material or titania-based inorganic material. The reinforcing fibers may be arranged in the resin to cross each other in a planar direction.

Meanwhile, the embodiment may use as the glass fiber, carbon fiber, aramid fiber (eg, aramid-based organic material), nylon, silica-based inorganic material or titania-based inorganic material.

However, the embodiment is not limited to this, and the insulating layer 310 may include other insulating materials.

For example, the insulating layer 310 may be rigid or flexible. For example, the insulating layer 310 may include glass or plastic. Specifically, the insulating layer 310 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire. For example, the insulating layer 310 may include an optically isotropic film. For example, the insulating layer 310 may include cyclic olefin copolymer (COC), cyclic olefin polymer (COP), optically isotropic PC, optically isotropic polymethylmethacrylate (PMMA), or the like. For example, the insulating layer 310 may be formed of a material containing an inorganic filler and an insulating resin. For example, the insulating layer 310 can be used as a thermosetting resins such as epoxy resins or a thermoplastic resin such as polyimide, as well as a resin containing reinforcing materials such as inorganic fillers such as silica and alumina, specifically, ABF (Ajinomoto Build-up Film), FR-4, BT (Bismaleimide Triazine), PID (Photo Imageable Dielectric resin), BT, etc.

The insulating layer 310 may have a thickness ranging from 10 μm to 60 um. For example, each of the insulating layers 310 may have a thickness ranging from 12 μm to 40 um. If the thickness of the insulating layer 310 is less than 5 μm, the circuit pattern included in the circuit board may not be stably protected. If the thickness of the insulating layer 310 exceeds 80 um, an overall thickness of the circuit board may increase. Additionally, if the thickness of the insulating layer 310 exceeds 80 μm, the thickness of the circuit pattern or via increases correspondingly, and the loss of signals transmitted through the circuit pattern may increase accordingly.

At this time, the thickness of the insulating layer 310 may correspond to the distance in the thickness direction between circuit patterns arranged in different layers. For example, the thickness of the insulating layer 310 may refer to a vertical distance from a lower surface of the first circuit pattern layer 320 to an upper surface of the second circuit pattern layer 330.

A circuit pattern is disposed on the surface of the insulating layer 310.

For example, a first circuit pattern layer 320 may be disposed on the upper surface of the insulating layer 310. For example, a second circuit pattern layer 330 may be disposed on the lower surface of the insulating layer 310.

In an embodiment, a circuit board may be manufactured using an Embedded Trace Substrate (ETS) method. Accordingly, at least one of the plurality of circuit patterns included in the circuit board may have an ETS structure. Here, the ETS structure may mean that an outermost circuit pattern disposed on the outermost layer has a structure embedded in the outermost insulating layer. That is, the ETS structure means that a cavity is provided concavely toward the bottom at the upper surface of the uppermost insulating layer disposed on the uppermost side of the circuit board, and a circuit pattern disposed at the uppermost side of the circuit board has a structure disposed in the cavity of the uppermost insulating layer.

For example, among the circuit patterns disposed on each layer of the circuit board, a circuit pattern disposed on at least one layer may have a structure embedded in an insulating layer. For example, in an embodiment, the circuit pattern disposed on the upper surface of a first uppermost insulating layer may have an ETS structure. For example, in an embodiment, the first circuit pattern layer 320 disposed on the upper surface of the insulating layer 310 may have an ETS structure. However, the embodiment is not limited to this, and a circuit pattern disposed at the lowermost side of the circuit board may have an ETS structure depending on an arrangement direction of the circuit board. Hereinafter, for convenience of description of the embodiment, the circuit pattern disposed at an uppermost side of the circuit board will be described as having an ETS structure.

The first circuit pattern layer 320 may have a structure embedded in the insulating layer 310. For example, some regions of the first circuit pattern layer 320 may have a structure embedded in the insulating layer 310. For example, an entire region of the first circuit pattern layer 320 may have a structure embedded in the insulating layer 310.

Here, a fact that the first circuit pattern layer 320 has a structure embedded in the insulating layer 310 may mean that at least a portion of the side surface of the first circuit pattern layer 320 is covered with the insulating layer 310.

In addition, a fact that the first circuit pattern layer 320 has a structure embedded in the insulating layer 310 may mean that the upper surface of the first circuit pattern layer 320 and the upper surface of the insulating layer 310 do not overlap in the vertical direction. Meanwhile, the lower surface of the first circuit pattern layer 320 may be covered by the insulating layer 310.

Meanwhile, the second circuit pattern layer 330 may be disposed on the lower surface of the insulating layer 310. The second circuit pattern layer 330 may protrude below the insulating layer 310.

The circuit pattern layers may be formed of at least one metal material selected from among gold (Au), silver (Ag), platinum (Pt), titanium (Ti), tin (Sn), copper (Cu), and zinc (Zn). In addition, the circuit pattern layers may be formed of paste or solder paste including at least one metal material selected from among gold (Au), silver (Ag), platinum (Pt), titanium (Ti), tin (Sn), copper (Cu), and zinc (Zn), which are excellent in bonding force. Preferably, the first circuit pattern layer 320 and the second circuit pattern layer 330 may be formed of copper (Cu) having high electrical conductivity and a relatively low cost.

The first circuit pattern layer 320 and the second circuit pattern layer 330 may have a thickness ranging from 5 μm to 20 μm. For example, the first circuit pattern layer 320 and the second circuit pattern layer 330 may have a thickness ranging from 6 μm to 17 μm. The first circuit pattern layer 320 and the second circuit pattern layer 330 may have a thickness ranging from 7 μm to 16 um. If the thickness of the first circuit pattern layer 320 and the second circuit pattern layer 330 is less than 5 μm, the resistance of the circuit pattern increases, and signal transmission efficiency may decrease accordingly. For example, if the thickness of the first circuit pattern layer 320 and the second circuit pattern layer 330 is less than 5 um, signal transmission loss may increase. For example, if the thickness of the first circuit pattern layer 320 and the second circuit pattern layer 330 exceeds 20 μm, the line width of the circuit patterns increases, and thus an overall volume of the circuit board may increase. an overall volume of the circuit board accordingly increases.

The circuit board of the embodiment includes a through electrode 340.

The through electrode 340 passes through the insulating layer 310 included in the circuit board, thereby making it possible to electrically connect circuit patterns arranged at different layers.

The through electrode 340 may electrically connect the first circuit pattern layer 320 and the second circuit pattern layer 330. For example, an upper surface of the through electrode 340 is directly connected to the lower surface of at least one of the first circuit pattern layers 320, and a lower surface of the through electrode 340 may be directly connected to the upper surface of at least one of the second circuit pattern layers 330.

At this time, the through electrode 340 may have a slope whose width gradually increases from the upper surface of the insulating layer 310 to the lower surface of the insulating layer 310. That is, the through electrode 340 is manufactured by the ETS method, and is formed by filling the inside of a through hole formed as the laser process proceeds at the lower surface of the insulating layer 310. Accordingly, the through electrode 340 may have a trapezoidal shape where the width of the upper surface is narrower than the width of the lower surface.

In this case, the via hole may be formed by any one of mechanical, laser, and chemical processing. When the via hole is formed by machining, it can be formed using methods such as milling, drilling, and routing. When the via hole is formed by laser processing, it can be formed using methods such as UV or $CO_2$ laser. When the via hole is formed by chemical processing, it can be formed using a chemical containing amino silane, ketones, or the like.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has a wide range of possible thicknesses.

As the laser processing drill, it is preferable to use a YAG (Yttrium Aluminum Garnet) laser, a $CO_2$ laser, or an ultraviolet (UV) laser. YAG laser is a laser that can process both copper foil layers and insulating layers, and CO2 laser is a laser that can process only insulating layers.

When the via hole is formed, the through electrode 340 of the embodiment may be formed by filling the inside of the through hole with a conductive material. The metal material forming the through electrode 340 may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, ink-jetting and dispensing.

Meanwhile, the circuit board of the embodiment may include a first protective layer 350 and a second protective layer 360. The first protective layer 350 and the second protective layer 360 may be disposed at uppermost and lowermost sides of the circuit board, respectively.

The first protective layer 350 may be disposed on the upper surface of an uppermost insulating layer disposed at the uppermost side of the circuit board. For example, the first protective layer 350 may be disposed on an upper surface of the insulating layer 310.

For example, the second protective layer 360 may be disposed on a lower surface of a lowermost insulating layer disposed at a lowermost side of the circuit board. For example, the second protective layer 360 may be disposed on a lower surface of the insulating layer 310.

The first protective layer 350 may include an opening. The opening of the first protective layer 350 may overlap in a vertical direction with the upper surface of the insulating layer 310, and may overlap in the vertical direction with the upper surface of at least one of the first circuit pattern layers 320. At this time, the opening of the first protective layer 350 that overlaps the first circuit pattern layer 320 in the vertical direction is not shown in the drawing. However, the first protective layer 350 may further include an opening that overlaps in the vertical direction with an upper surface of a pad portion (not shown) of the first circuit pattern layer 320.

Meanwhile, the first protective layer 350 of a first embodiment may include a first opening OR1 that overlaps the upper surface of the insulating layer 310 in the vertical direction and does not overlap the upper surface of the first circuit pattern layer 320 in the vertical direction.

Additionally, the second protective layer 360 may include an opening. The second protective layer 360 may vertically overlap the lower surface of the insulating layer 310 and may vertically overlap the lower surface of at least one of the second circuit pattern layers 330. At this time, the opening of the second protective layer 360 that overlaps the second circuit pattern layer 330 in the vertical direction is not shown in the drawing. However, the second protective layer 360 may further include an opening that overlaps in the vertical direction with the lower surface of the pad portion (not shown) of the second circuit pattern layer 330.

Meanwhile, the second protective layer 360 of the first embodiment may include a second opening OR2 that vertically overlaps the lower surface of the insulating layer 310 but does not vertically overlap the lower surface of the second circuit pattern layer 330.

At this time, a width of the first protective layer 350 may be narrower than a width of the insulating layer 310. For example, the first protective layer 350 may have a width as narrow as the width of the first opening OR1 compared to the width of the insulating layer 310.

Additionally, a width of the second protective layer 360 may be narrower than the width of the insulating layer 310. For example, the second protective layer 360 may have a width as narrow as the width of the second opening OR2 compared to the width of the insulating layer 310.

For example, the upper surface 310T of the insulating layer 310 ma include a first upper region RT1 overlapping in the vertical direction with the first protective layer 350, and a second upper region RT2 other than the first upper region RT1. For example, the upper surface 310T of the insulating layer 310 may include a first upper region RT1 that overlaps the first protective layer 350 in the vertical direction. For example, the upper surface 310T of the insulating layer 310 may include a second upper region RT2 vertically overlapping the first opening OR1 of the first protective layer 350.

At this time, the first upper region RT1 may be adjacent to outermost ends SL1 and SL2 of the insulating layer 310 compared to the second upper region RT2. For example, the second upper region RT2 may be a region adjacent to the outermost ends SL1 and SL2 of the upper surface 310T of the insulating layer 310. This means that first opening OR1 of the first protective layer 350 vertically overlaps a region adjacent to the outermost ends SL1 and SL2 of the insulating layer 310 among the upper surface 310T of the insulating layer 310.

For example, the second upper region RT2 may be an edge region or an outer region adjacent to the outermost ends SL1 and SL2 of the upper surface 310T of the insulating layer 310. Additionally, the first upper region RT1 may be a central region of the upper surface of the insulating layer 310, excluding the second upper region RT2.

Meanwhile, the lower surface 310B of the insulating layer 310 may include a first lower region RB1 vertically overlapping with the second protective layer 360 and a second lower region RB2 other than the first lower region RBT. For example, the lower surface 310B of the insulating layer 310 may include a first lower region RB1 that overlaps the second protective layer 360 in the vertical direction. For example, the lower surface 310B of the insulating layer 310 may include a second lower region RB2 that overlaps the second opening OR2 of the second protective layer 360 in the vertical direction.

At this time, the first lower region RBT may be adjacent to the outermost ends SL1 and SL2 of the insulating layer 310 compared to the second lower region RB2. For example, the second lower region RB2 may be a region adjacent to the outermost ends SL1 and SL2 of the insulating layer 310 among the lower surfaces 310B of the insulating layer 310. This may mean that the second opening OR2 of the second protective layer 360 vertically overlaps a region adjacent to the outermost ends SL1 and SL2 of the insulating layer 310 of the lower surface 310B of the insulating layer 310.

For example, the second lower region RB2 may be an edge region or an outer region adjacent to the outermost ends SL1 and SL2 of the insulating layer 310 among the lower surface 310B of the insulating layer 310. Additionally, the first lower region RBT may be the central region of the lower surface 310B of the insulating layer 310 excluding the second lower region RB2.

At this time, a portion of the second upper region RT2 of the upper surface 310T of the insulating layer 310 of the embodiment can be overlapped in a vertical direction with a portion of the second lower region RB2 of the lower surface 310B of the insulating layer 310. This means that neither the first protective layer 350 nor the second protective layer 360 is disposed in a partial region of the upper surface of the insulating layer 310 and a partial region of the lower surface of the insulating layer 310 overlapping in the vertical direction with the partial region of the upper surface. In addition, the partial region of the upper surface and the partial region of the lower surface are the second upper region RT2 and the second lower region RB2. For example, a partial region of the upper surface 310T adjacent to the outermost ends SL1 and SL2 of the insulating layer 310 and a partial region of the lower surface 310B adjacent to the outermost ends SL1 and SL2 may vertically overlap the first opening OR1 of the first protective layer 350 and the second opening OR2 of the second protective layer 360, respectively.

As described above, the embodiment allows the second upper region RT2 of the upper surface 310T of the insulating layer 310 adjacent to the outermost ends SL1 and SL2 of the insulating layer 310 not to overlap the first protective layer 350 in the vertical direction. Furthermore, the embodiment allows a second lower region RB2 on the lower surface 310B of the insulating layer 310 adjacent to the outermost ends SL1 and SL2 of the insulating layer 310 to not overlap the second protective layer 360 in the vertical direction.

Accordingly, the embodiment prevents the second upper region RT2 and the second lower region RB2 from shrinking due to curing of the first protective layer 350 and the second protective layer 360 during a process of manufacturing the circuit board. Accordingly, the embodiment can minimize warpage that occurs due to curing shrinkage of the first protective layer 350 and the second protective layer 360 in the second upper region RT2 and the second lower region RB2.

Furthermore, the embodiment allows the areas of the second upper region RT2 and the second lower region RB2 to be different from each other, so that warpage of the circuit board occurs in a specific direction. For example, the embodiment allows the area of the first opening OR1 of the first protective layer 350 and the area of the second opening OR2 of the second protective layer 360 to be different from each other, so that the circuit board Causes warpage to occur in a specific direction. For example, the embodiment allows the volume of the first protective layer 350 and the volume of the second protective layer 360 to be different from each other, so that warpage of the circuit board occurs in a specific direction.

Specifically, in the embodiment, the area of the second upper region RT2 is smaller than the area of the second lower region. For example, in the embodiment, the area of the first opening OR1 of the first protective layer 350 is smaller than the area of the second opening OR2 of the second protective layer 360. For example, in the embodiment, the volume of the first protective layer 350 is larger than the volume of the second protective layer 360.

Accordingly, the embodiment allows a cure shrinkage rate in the second upper region RT2 by the first protective layer 350 to be greater than the cure shrinkage rate in the second lower region RB2 by the second protective layer 360.

In addition, the curing shrinkage rate in the second upper region (RT2) due to the first protective layer 350 is greater, and accordingly the embodiment allows the second upper region RT2 and the second lower region RB2 of the insulating layer 310 to bend in a direction toward an upper side of the second upper region (RT2), where the cure shrinkage rate is greater. At this time, in a circuit board with a general ETS structure, such as the comparative example, warpage occurs in the crying direction. In addition, the embodiment allows the circuit board to be bent in the smile direction by adjusting the curing shrinkage rate as described above, thereby improving the flatness of the circuit board.

Specifically, the second lower region RB2 of the lower surface 310B of the insulating layer 310 may be divided into a plurality of regions.

For example, the second lower region RB2 of the lower surface 310B of the insulating layer 310 may include a second-first lower region RB2-1 overlapping with the first upper region RT1 of the upper surface 310T of the insulating layer 310 and a second-second lower region RB2-2 excluding the second-first lower region RB2-1. Additionally, the second-second lower region RB2-2 may be closer to the outermost ends SL1 and SL2 of the insulating layer 310 than the second-first lower region RB2-1.

For example, the second-second lower region RB2-2 may vertically overlap the second upper region RT2 of the upper surface 310T of the insulating layer 310. Accordingly, the embodiment may allow the second lower region RB2 to have a width larger than the first upper region RT2 by the second-first lower region RB2-1. For example, the second opening OR2 of the second protective layer 360 may have a width greater than the first opening OR1 of the first protective layer 350 by the width of the second-first lower region RB2-1.

The circuit board in the embodiment may have improved warpage characteristics.

Specifically, the circuit board includes a first protective layer disposed on the upper surface of the insulating layer and a second protective layer disposed on the lower surface of the insulating layer. Additionally, the upper surface of the insulating layer includes a first upper region that overlaps the first protective layer in a vertical direction and a second upper region excluding the first upper region. Correspondingly, the lower surface of the insulating layer includes a first lower region vertically overlapping with the second protective layer and a second lower region excluding the first lower region. At this time, at least a portion of the second upper region may overlap in a vertical direction with at least a portion of the second lower region. Furthermore, the second upper region is an edge region adjacent to the outermost end of the insulating layer at the upper surfaces of the insulating layer, and the second lower region is an edge region adjacent to the outermost end of the insulating layer at the lower surface of the insulating layer. Accordingly, the embodiment can reduce shrinkage due to curing of the first protective layer and the second protective layer in the edge region of the insulating layer, and thus improve the warpage characteristics of the circuit board.

Furthermore, in the embodiment, the second lower region of the insulating layer includes a second-first region that overlaps a first upper region of the insulating layer, and a second-second region excluding the second-first region. That is, a volume of the second protective layer in the embodiment may be as small as an area of the second-second region compared to a volume of the first protective layer. Accordingly, a curing shrinkage rate in the second upper region of the insulating layer due to the first protective layer may be greater than a curing shrinkage rate in the second lower region of the insulating layer due to the second protective layer. Accordingly, the circuit board in the embodiment may be bent upward due to curing shrinkage caused by the first protective layer. At this time, the circuit board in the general ETS structure is bent in a crying direction corresponding to a lower direction. Accordingly, the embodiment can suppress the generation of warpage in the crying direction or shift the warpage direction of the circuit board to the smile direction, thereby improving the warpage characteristics of the circuit board.

—Package Substrate—

Meanwhile, at least one chip may be mounted on the circuit board according to the embodiment, and through this, it may be provided as a package substrate. The package substrate may represent a substrate region of any one of the semiconductor packages shown in FIGS. 2A to 2G.

For example, the package substrate of the embodiment includes at least one chip mounted on the circuit board of FIG. 4, a molding layer for molding the chip, and a connection part for coupling the chip or an external substrate.

For example, the package substrate includes a first connection part (not shown) disposed on the first circuit pattern layer 320 disposed at the uppermost side of the circuit board. The first connection part may be a solder ball.

And, a chip may be mounted on the solder ball. At this time, the chip may be a processor chip. For example, the chip may be at least one application processor (AP) chip selected from a central processor (e.g., CPU), a graphics processor (e.g., GPU), a digital signal processor, a cryptographic processor, microprocessor, and a microcontroller.

At this time, at least two chips may be mounted on the circuit board of the embodiment. In an embodiment, at least two chips selected from a central processor (e.g., CPU), a graphics processor (e.g., GPU), a digital signal processor, a cryptographic processor, microprocessor, and a microcontroller may be disposed on the circuit board at a regular distance. For example, the package substrate of the embodiment may include a central processor chip and a graphics processor chip, but is not limited thereto.

Meanwhile, the plurality of chips may be spaced apart from each other at a predetermined distance on the circuit board. For example, the distance between the plurality of chips may be 150 μm or less. For example, the distance between the plurality of chips may be 120 μm or less. For example, the distance between the plurality of chips may be 100 μm or less.

Preferably, the distance between the plurality of chips may range from 60 μm to 150 um. Preferably, the distance between the plurality of chips may range from 70 μm to 120 um. Preferably, the distance between the plurality of chips may range from 80 μm to 110 um. If the distance between the plurality of chips is less than 60 um, problems with operation reliability may occur due to mutual interference between the plurality of chips. If the distance between the plurality of chips is greater than 150 um, signal transmission loss may increase as the distance between the plurality of chips increases. If the distance between the plurality of chips is greater than 150 μm, the volume of the package substrate may increase.

—Method of Manufacturing Circuit Board—

Hereinafter, a method of manufacturing a circuit board according to an embodiment will be described.

The circuit board of the embodiment may be manufactured in strip units. For example, the circuit board of the embodiment may be manufactured in a panel unit.

For convenience of explanation, hereinafter, the description will be based on a specific unit region in the strip region of the panel.

FIGS. 6A to 6I are views for explaining a method for manufacturing a circuit board according to a first embodiment in order of processes.

The embodiment may allow a plurality of circuit boards (e.g., a plurality of units) to be manufactured simultaneously in a panel unit or even a strip unit.

Referring to FIG. 6A, the embodiment prepares a carrier board for manufacturing the circuit board.

The carrier board includes a carrier insulating layer CBT and a carrier copper foil layer CB2 disposed on the carrier insulating layer CBT.

At this time, the carrier copper foil layer CB2 may be disposed on at least one of the upper and lower surfaces of the carrier insulating layer CB1. For example, the carrier copper foil layer CB2 may be disposed on only one side of the carrier insulating layer CBT. As another example, the carrier copper foil layer CB2 may be disposed on both sides of the carrier insulating layer CBT.

In addition, when the carrier copper foil layer CB2 is disposed on both sides of the carrier insulating layer CBT, a process of manufacturing the circuit board can be performed simultaneously on both sides of the carrier insulating layer CBT.

However, for convenience of explanation, the description will be made on the assumption that the process of manufacturing the circuit board is carried out only on the lower side of the carrier board.

At this time, the carrier insulating layer CBT and the carrier copper clad layer CB2 may be CCL (Copper Clad Laminate).

Next, the embodiment may proceed with a process of forming a circuit pattern on the lower surface of the carrier copper foil layer CB2, as shown in FIG. 6B.

At this time, the lower surface of the carrier copper foil layer CB2 may be divided into a plurality of regions. For example, the lower surface of the carrier copper foil layer CB2 includes a unit region UR corresponding to an effective region based on the sawing line, and a dummy region DR other than the unit region UR.

In addition, the embodiment may proceed with a process of forming the first circuit pattern layer 320 on the lower surface of the unit region UR of the carrier copper foil layer CB2.

Next, the embodiment may proceed with a process of laminating the insulating layer 310 on the lower surface of the carrier copper foil layer (CB2) and the lower surface of the first circuit pattern layer 320, as shown in FIG. 6C. At this time, the insulating layer 310 may be formed not only on the lower surface of the unit region UR of the carrier copper foil layer CB2 but also on the lower surface of the dummy region DR.

Next, the embodiment may proceed with a process of forming a through hole VH penetrating the insulating layer 310, as shown in FIG. 6D. The through hole VH may be formed through a laser process, but is not limited thereto.

Additionally, the through hole VH passes through the insulating layer 310 and may overlap the lower surface of at least one of the first circuit pattern layers 320 in a vertical direction.

Next, the embodiment may proceed with a process of forming a through electrode 340 that fills the through hole (VH) and a second circuit pattern layer 330 on the lower surface of the insulating layer 310, as shown in FIG. 6E, Next, the embodiment may proceed with a process of removing the carrier insulating layer CB1 and the carrier copper foil layer CB2, as shown in FIG. 6F. Accordingly, the upper surface of the insulating layer 310 and the upper surface of the first circuit pattern layer 320 may be exposed. At this time, the upper and lower surfaces of the insulating layer 310 include a unit region UR and a dummy region DR.

Next, the embodiment may proceed with a process of forming a first protective layer 350 on the upper surface 310T of the insulating layer 310 and a process of forming a second protective layer 360 on the lower surface of the insulating layer 310, as shown in FIG. 6G.

At this time, the first protective layer 350 may be formed on a portion of the upper surface of the unit region UR of the insulating layer 310. To this end, the first protective layer 350 may include a first opening OR1. For example, the upper surface 310T of the insulating layer 310 may include a first upper region RT1 vertically overlapping with the first protective layer 350, and a second upper region RT2 other than the first upper region RT1. For example, the upper surface 310T of the insulating layer 310 may include a first upper region RT1 that overlaps the first protective layer 350 in the vertical direction. For example, the upper surface 310T of the insulating layer 310 may include a second upper region RT2 vertically overlapping the first opening OR1 of the first protective layer 350.

At this time, the first upper region RT1 may be adjacent to the dummy region DR, which is the outermost end SL1 and SL2 of the insulating layer 310 compared to the second upper region RT2.

Correspondingly, the second protective layer 360 may also be formed on a portion of the lower surface of the unit region UR of the insulating layer 310. To this end, the second protective layer 360 may include a second opening OR2. For example, the lower surface 310B of the insulating layer 310 may include a first lower region RB1 vertically overlapping with the second protective layer 360, and a second lower region RB2 other than the first lower region RB1. For example, the lower surface 310B of the insulating layer 310 may include a first lower region RB1 that overlaps the second protective layer 360 in the vertical direction. For example, the lower surface 310B of the insulating layer 310 may include a second lower region RB2 that overlaps the second opening OR2 of the second protective layer 360 in the vertical direction.

In addition, a portion of the second upper region RT2 of the upper surface 310T of the insulating layer 310 may overlap in the vertical direction with a portion of the second lower region RB2 of the lower surface 310B of the insulating layer 310.

Next, the embodiment may proceed with a process of sawing based on the sawing lines SL1 and SL2 of the dummy region DR to separate the circuit board of the unit region UR, as shown in FIGS. 6H and 6I.

The circuit board in the embodiment may have improved warpage characteristics.

Specifically, the circuit board includes a first protective layer disposed on the upper surface of the insulating layer and a second protective layer disposed on the lower surface of the insulating layer. Additionally, the upper surface of the insulating layer includes a first upper region that overlaps the first protective layer in a vertical direction and a second upper region excluding the first upper region. Correspondingly, the lower surface of the insulating layer includes a first lower region vertically overlapping with the second protective layer and a second lower region excluding the first lower region. At this time, at least a portion of the second upper region may overlap in a vertical direction with at least a portion of the second lower region. Furthermore, the second upper region is an edge region adjacent to the outermost end of the insulating layer at the upper surfaces of the insulating layer, and the second lower region is an edge region adjacent to the outermost end of the insulating layer at the lower surface of the insulating layer. Accordingly, the embodiment can reduce shrinkage due to curing of the first protective layer and the second protective layer in the edge region of the insulating layer, and thus improve the warpage characteristics of the circuit board.

Furthermore, in the embodiment, the second lower region of the insulating layer includes a second-first region that overlaps a first upper region of the insulating layer, and a second-second region excluding the second-first region. That is, a volume of the second protective layer in the embodiment may be as small as an area of the second-second region compared to a volume of the first protective layer. Accordingly, a curing shrinkage rate in the second upper region of the insulating layer due to the first protective layer may be greater than a curing shrinkage rate in the second lower region of the insulating layer due to the second protective layer. Accordingly, the circuit board in the embodiment may be bent upward due to curing shrinkage caused by the first protective layer. At this time, the circuit board in the general ETS structure is bent in a crying direction corresponding to a lower direction. Accordingly, the embodiment can suppress the generation of warpage in the crying direction or shift the warpage direction of the circuit board to the smile direction, thereby improving the warpage characteristics of the circuit board.

Circuit Board of Second Embodiment

FIG. 7 is a view showing a circuit board according to a second embodiment, and FIGS. 8A and 8B are diagrams for explaining a structure of FIG. 7.

Referring to FIGS. 7, 8A, and 8B, the circuit board 300A according to the second embodiment includes an insulating layer 310A, a first circuit pattern layer 320, a second circuit pattern layer 330, a through electrode 340, a first protective layer 350 and a second protective layer 360.

At this time, in the circuit board 300A of the second embodiment, parts other than the insulating layer 310A are substantially the same as the circuit board 300 according to the first embodiment of FIG. 3, and, accordingly, the description of a same configuration will be omitted below.

An upper surface 310T of the insulating layer 310A of the circuit board 300A of the second embodiment may include a first upper region RT1 overlapping in the vertical direction with the first protective layer 350 and a second upper region RT2 other than the first upper region RT1. For example, the upper surface 310T of the insulating layer 310A may include a first upper region RT1 that overlaps the first protective layer 350 in the vertical direction. For example, the upper surface 310T of the insulating layer 310A may include a second upper region RT2 vertically overlapping the first opening OR1 of the first protective layer 350.

For example, the second upper region RT2 may be an edge region or an outer region adjacent to the outermost ends SL1 and SL2 of the upper surface 310T of the insulating layer 310A. Additionally, the first upper region RT1 may be a central region of the upper surface of the insulating layer 310A excluding the second upper region RT2.

Meanwhile, a lower surface 310B of the insulating layer 310A may include a first lower region RB1 vertically overlapping with the second protective layer 360 and a second lower region RB2 other than the first lower region RB1. For example, the lower surface 310B of the insulating layer 310A may include a first lower region RB1 that overlaps the second protective layer 360 in the vertical direction. For example, the lower surface 310B of the insulating layer 310A may include a second lower region RB2 that overlaps the second opening OR2 of the second protective layer 360 in the vertical direction.

At this time, the first lower region RB1 may be adjacent to the outermost ends SL1 and SL2 of the insulating layer 310A compared to the second lower region RB2. For example, the second lower region RB2 may be a region adjacent to the outermost ends SL1 and SL2 of the insulating layer 310A among the lower surface 310B of the insulating layer 310A. This means that the second opening OR2 of the second protective layer 360 vertically overlaps a region adjacent to the outermost ends SL1 and SL2 of the insulating layer 310A among the lower surfaces 310B of the insulating layer 310A.

In addition, the second lower region RB2 of the lower surface 310B of the insulating layer 310A may include a second-first lower region RB2-1 overlapping with the first upper region RT1 of the upper surface 310T of the insulating layer 310A and a second-second lower region RB2-2 excluding the second-first lower region RB2-1. Additionally, the second-second lower region RB2-2 may be closer to the outermost ends SL1 and SL2 of the insulating layer 310A than the second-first lower region RB2-1.

For example, the second-second lower region RB2-2 may vertically overlap the second upper region RT2 of the upper surface 310T of the insulating layer 310A. Accordingly, the embodiment may allow the second lower region RB2 to have a width greater than the first upper region RT2 by the second-first lower region RB2-1. For example, the second opening OR2 of the second protective layer 360 may have a width larger than the first opening OR1 of the first protective layer 350 by the width of the second-first lower region RB2-1.

Meanwhile, at least one recess RP may be provided at the upper surface of the insulating layer 310A. For example, a recess RP may be formed in the second upper region RT2 of the upper surface of the insulating layer 310A. The recess RP may have a shape corresponding to the first circuit pattern layer 320.

Specifically, the second embodiment may allow a recess RP from which the first circuit pattern layer 320 is removed to be provided at the upper surface of the insulating layer 310A overlapping in the vertical direction with the first opening OR1 of the first protective layer 350.

For example, in the process of forming the first circuit pattern layer 320 of the circuit board of the second embodiment, a portion of the first circuit pattern layer 320 may also be formed in the second upper region RT2 on the upper surface of the insulating layer 310A.

In addition, the first protective layer 350 is not disposed on the second upper region RT2 after the circuit board is finally manufactured, and accordingly, the first circuit pattern layer 320 disposed in the second upper region RT2 may not be protected by the first protective layer 350. At this time, if the first circuit pattern layer 320 is disposed in the second upper region RT2 of the upper surface of the insulating layer 310A that does not overlap the first protective layer 350 in the vertical direction, electrical reliability problems such as short circuits may occur during the circuit board assembly process.

Accordingly, the second embodiment may further proceed with a process of etching and removing the first circuit pattern layer 320 disposed in the second upper region RT2 of the upper surface 310T of the insulating layer 310A. Accordingly, a recess RP in which the first circuit pattern layer 320 is removed may be formed in the second upper region RT2.

At this time, a width of the recess RP may be the same as a width of the first circuit pattern layer 320. Additionally, a depth of the recess RP may be the same as a thickness of the first circuit pattern layer 320. For example, a lower surface of the recess RP may be located on the same plane as a lower surface of the first circuit pattern layer 320.

The recess RP will be described in detail as follows.

FIGS. 8A and 8B, in the embodiment, in a process of forming the first circuit pattern layer 320 of FIG. 6B, a dummy pattern 320D can be formed that overlaps the unit region UR and the dummy region DR in the vertical direction.

The dummy pattern 320D may be used to improve reliability in the process of laminating the insulating layer 310 on the lower surface of the carrier copper foil layer CB2 and the lower surface of the first circuit pattern layer 320. For example, a density of the first circuit pattern layer 320 formed on the lower surface of the carrier copper foil layer CB2 may decrease as it approaches the dummy region DR. For example, the first circuit pattern layer 320 may not be formed in a unit region UR adjacent to the dummy region DR on the lower surface of the carrier copper foil layer CB2. Accordingly, a lamination thickness of the insulating layer 310 in a high density portion of the first circuit pattern layer 320 may be different from a lamination thickness of the insulating layer 310 in a low density portion. Additionally, a low density portion of the first circuit pattern layer 320 may include voids, which are empty spaces within the insulating layer 310. Additionally, the voids may act as a factor in reducing the strength of the insulating layer 310 and may serve as a factor in reducing the flatness of the insulating layer 310.

Accordingly, the embodiment may proceed with a process of manufacturing the circuit board with the dummy pattern 320D formed in the dummy region DR and a region adjacent to the dummy region DR as described above.

At this time, the dummy pattern 320D is formed in a second upper region RT2 of the upper surface of the insulating layer that does not overlap in the vertical direction with the first protective layer 350. Accordingly, the dummy pattern 320D may be removed by etching after the first protective layer 350 is formed, thereby remaining as a recess RP.

Therefore, the recess RP included in the circuit board according to the second embodiment may mean a portion from which the dummy pattern 320 formed in the edge region of the unit region UR and the dummy region DR are removed in the process of manufacturing the circuit board.

A width of the recess RP may be the same as A width of the first circuit pattern layer 320. For example, the width of the recess RP may be the same as a width of a trace of the first circuit pattern layer 320.

Alternatively, the width of the recess RP may be greater than the width of the first circuit pattern layer 320. In order to further increase laminating reliability (e.g., remove voids and improve flatness) in the area where the dummy pattern is formed in a process of laminating the insulating layer, the width of the dummy pattern 320D may be greater than the width of the first circuit pattern layer 320. Accordingly, the width of the recess RP in the embodiment may be larger than the width of the first circuit pattern layer 320. For example, the recess RP may have a level difference from the first circuit pattern layer 320.

Circuit Board of Third Embodiment

FIG. 9 is a view showing a circuit board according to a third embodiment.

Referring to FIG. 9, the circuit board 300B according to the third embodiment includes an insulating layer 310, a first circuit pattern layer 320, a second circuit pattern layer 330, a through electrode 340, a first protective layer 350B and a second protective layer 360.

At this time, in the circuit board 300B of the third embodiment, parts other than the first protective layer 350B are substantially the same as the circuit board 300 according to the first embodiment of FIG. 4, and, accordingly, the description of a same configuration will be omitted below.

The first protective layer 350B of the circuit board 300B of the third embodiment may overlap the upper surface of the insulating layer 310 in the vertical direction.

Accordingly, an upper surface 310T of the insulating layer 310 may include only a first upper region RT1 that overlaps the first protective layer 350B in the vertical direction.

In addition, a lower surface 310B of the insulating layer 310 may include a first lower region RB1 vertically overlapping with the second protective layer 360 and a second lower region RB2 other than the first lower region RB1. For example, the lower surface 310B of the insulating layer 310A may include a first lower region RB1 that overlaps the second protective layer 360 in the vertical direction. For example, the lower surface 310B of the insulating layer 310A may include a second lower region RB2 that overlaps the second opening OR2 of the second protective layer 360 in the vertical direction.

At this time, the first lower region RB1 may be adjacent to the outermost ends SL1 and SL2 of the insulating layer 310A compared to the second lower region RB2. For example, the second lower region RB2 may be a region adjacent to the outermost ends SL1 and SL2 of the insulating layer 310 among the lower surfaces 310B of the insulating layer 310. This means that the second opening OR2 of the second protective layer 360 may vertically overlap a region adjacent to the outermost ends SL1 and SL2 of the insulating layer 310 among the lower surface 310B of the insulating layer 310.

Additionally, the second lower region RB2 of the lower surface 310B of the insulating layer 310 may overlap the first upper region RT1 of the upper surface 310T of the insulating layer 310. For example, the second lower region RB2 of the lower surface 310B of the insulating layer 310 may overlap the first upper region RT1 of the upper region RT1 of the insulating layer 310.

That is, the third embodiment reduces the volume of the second protective layer 360 while maintaining the volume of the first protective layer 350B the same as in the comparative example, thereby improving the warpage characteristics of the circuit board.

Circuit Board of Fourth Embodiment

FIG. 10 is a view showing a circuit board according to a fourth embodiment.

Referring to FIG. 10, the circuit board 300C according to the fourth embodiment includes an insulating layer 310, a first circuit pattern layer 320C, a second circuit pattern layer 330, a through electrode 340, a first protective layer 350C and a second protective layer 360.

At this time, in the circuit board 300C of the fourth embodiment, parts other than the first circuit pattern layer 320C are substantially the same as the circuit board 300B according to the third embodiment of FIG. 8, and, accordingly, the description of a same configuration will be omitted below.

At least one of the first circuit pattern layers 320C of the circuit board 300C of the fourth embodiment vertically overlaps the second lower region RB2 of the lower surface 310B of the insulating layer 310.

At this time, in the second embodiment, the first circuit pattern layer 320C, which vertically overlaps the second lower region RT2 of the lower surface 310B of the insulating layer 310, is removed due to electrical reliability problems such as short circuit, and accordingly, the circuit board includes a recess RP.

Unlike this, the upper surface 310T of the insulating layer 310 in the fourth embodiment includes only the first upper region RT1, and accordingly, the edge region of the upper surface 310T of the insulating layer 310 also overlaps the first protective layer 350C in the vertical direction.

Accordingly, at least one of the first circuit pattern layers 320C of the fourth embodiment may overlap the second lower region RB2 of the lower surface 310B of the insulating layer 310 in the vertical direction.

Furthermore, at least one of the first circuit pattern layers 320C may overlap the outermost ends SL1 and SL2 of the insulating layer 310 in a vertical direction. For example, at least one side surface of the first circuit pattern layer 320C may be positioned on the same vertical line as the outermost ends SL1 and SL2 of the insulating layer 310. For example, at least one side surface of the first circuit pattern layer 320C may be exposed to the outermost ends SL1 and SL2 of the insulating layer 310.

For example, as shown in FIGS. 8A and 8B, a dummy pattern 320D is formed in the unit region UR and the dummy region DR in a process of manufacturing the circuit board. At this time, as shown in FIG. 7, if the first protective layer is not disposed on the dummy pattern 320D in the final manufactured circuit board, the dummy pattern 320D is removed by etching to provide a recess RP.

Unlike this, as shown in FIG. 10, if the dummy pattern 320D is covered by the first protective layer, the dummy pattern 320D may not be removed, and thus may be exposed to the outermost edges SL1 and SL2 of the insulating layer 310.

The circuit board in the embodiment may have improved warpage characteristics.

Specifically, the circuit board includes a first protective layer disposed on the upper surface of the insulating layer and a second protective layer disposed on the lower surface of the insulating layer. Additionally, the upper surface of the insulating layer includes a first upper region that overlaps the first protective layer in a vertical direction and a second upper region excluding the first upper region. Correspondingly, the lower surface of the insulating layer includes a first lower region vertically overlapping with the second protective layer and a second lower region excluding the first lower region. At this time, at least a portion of the second upper region may overlap in a vertical direction with at least a portion of the second lower region. Furthermore, the second upper region is an edge region adjacent to the outermost end of the insulating layer at the upper surfaces of the insulating layer, and the second lower region is an edge region adjacent to the outermost end of the insulating layer at the lower surface of the insulating layer. Accordingly, the embodiment can reduce shrinkage due to curing of the first protective layer and the second protective layer in the edge region of the insulating layer, and thus improve the warpage characteristics of the circuit board.

Furthermore, in the embodiment, the second lower region of the insulating layer includes a second-first region that overlaps a first upper region of the insulating layer, and a second-second region excluding the second-first region. That is, a volume of the second protective layer in the embodiment may be as small as an area of the second-second region compared to a volume of the first protective layer. Accordingly, a curing shrinkage rate in the second upper region of the insulating layer due to the first protective layer may be greater than a curing shrinkage rate in the second lower region of the insulating layer due to the second protective layer. Accordingly, the circuit board in the embodiment may be bent upward due to curing shrinkage caused by the first protective layer. At this time, the circuit board in the general ETS structure is bent in a crying direction corresponding to a lower direction. Accordingly, the embodiment can suppress the generation of warpage in the crying direction or shift the warpage direction of the circuit board to the smile direction, thereby improving the warpage characteristics of the circuit board.

On the other hand, when the circuit board having the above-described characteristics of the invention is used in an IT device or home appliance such as a smart phone, a server computer, a TV, and the like, functions such as signal transmission or power supply can be stably performed. For example, when the circuit board having the features of the present invention performs a semiconductor package function, it can function to safely protect the semiconductor chip from external moisture or contaminants, or alternatively, it is possible to solve problems of leakage current, electrical short circuit between terminals, and electrical opening of terminals supplied to the semiconductor chip. In addition, when the function of signal transmission is in charge, it is possible to solve the noise problem. Through this, the circuit board having the above-described characteristics of the invention can maintain the stable function of the IT device or home appliance, so that the entire product and the circuit board to which the present invention is applied can achieve functional unity or technical interlocking with each other.

When the circuit board having the characteristics of the invention described above is used in a transport device such as a vehicle, it is possible to solve the problem of distortion of a signal transmitted to the transport device, or alternatively, the safety of the transport device can be further improved by safely protecting the semiconductor chip that controls the transport device from the outside and solving the problem of leakage current or electrical short between terminals or the electrical opening of the terminal supplied to the semiconductor chip. Accordingly, the transportation device and the circuit board to which the present invention is applied can achieve functional integrity or technical interlocking with each other. Furthermore, when the circuit board having the above-described characteristics of the invention is used in a transportation device such as a vehicle, it is possible to transmit a high-current signal required by the vehicle at a high speed, thereby improving the safety of the transportation device. Furthermore, the circuit board and the semiconductor package including the same can be operated normally even in an unexpected situation occurring in various driving environments of the transportation device, thereby safely protecting the driver.

The characteristics, structures and effects described in the embodiments above are included in at least one embodiment but are not limited to one embodiment. Furthermore, the characteristics, structures, and effects and the like illustrated in each of the embodiments may be combined or modified even with respect to other embodiments by those of ordinary skill in the art to which the embodiments pertain. Thus, it should be construed that contents related to such a combination and such a modification are included in the scope of the embodiment.

The above description has been focused on the embodiment, but it is merely illustrative and does not limit the embodiment. A person skilled in the art to which the embodiment pertains may appreciate that various modifications and applications not illustrated above are possible without departing from the essential features of the embodiment. For example, each component particularly represented in the embodiment may be modified and implemented. In addition, it should be construed that differences related to such changes and applications are included in the scope of the embodiment defined in the appended claims.

What is claimed is:

1. A circuit board comprising:

an insulating layer;

a first circuit pattern layer disposed on the insulating layer;

a first protective layer disposed on the first circuit pattern layer and having a width narrower than a width of the insulating layer;

a second circuit pattern layer disposed under the insulating layer; and a second protective layer disposed under the second circuit pattern layer and having a width narrower than the width of the insulating layer, wherein the first protective layer includes a region that does not overlap the second protective layer and the second circuit pattern layer along a vertical direction, wherein a first surface of the insulating layer includes a first region overlapping at least one of the first protective layer and the first circuit pattern layer in the vertical direction, and a second region excluding the first region, wherein a second surface opposite to the first surface of the insulating layer includes a third region overlapping at least one of the second protective layer and the second circuit pattern layer in the vertical direction, and a fourth region excluding the third region, and wherein a portion of the second region overlaps a portion of the fourth region in the vertical direction, wherein at least a portion of the first circuit pattern layer is embedded in the insulating layer, wherein the second region of the insulating layer includes a recess that is concave toward the second surface of the insulating layer, and wherein the recess does not overlap the first protective layer and the first circuit pattern layer in the vertical direction.

2. The circuit board of claim 1, wherein the width of the insulating layer, the width of the first protective layer and the width of the second protective layer are different from each other, wherein the insulating layer includes a first side end, wherein the first protective layer includes a second side end closest to the first side end, and wherein a horizontal distance from the first side end to a first circuit pattern layer closest to the first side end is greater than or equal to a horizontal distance from the first side end to the second side end.

3. The circuit board of claim 2, wherein the second protective layer includes a third side end closest to the first side end, and wherein a horizontal distance from the first side end to a second circuit pattern layer closest to the first side end is greater than or equal to a horizontal distance from the first side end to the third side end.

4. The circuit board of claim 1, wherein the second region is a region adjacent to an outermost end of the insulating layer at the first surface of the insulating layer, and wherein the fourth region is a region adjacent to the outermost end of the insulating layer at the second surface of the insulating layer.

5. The circuit board of claim 4, wherein the first region is a central region of the first surface of the insulating layer, wherein the second region is an edge region of the first surface of the insulating layer, wherein the third region is a central region of the second surface of the insulating layer, and wherein the fourth region is an edge region of the second surface of the insulating layer.

6. The circuit board of claim 1, wherein the fourth region includes a fourth-first region overlapping the first region in the vertical direction, and a fourth-second region excluding the fourth-first region.

7. The circuit board of claim 6, wherein the second region overlaps the fourth-second region in the vertical direction.

8. The circuit board of claim 1, wherein a width of the recess is the same as a width of the first circuit pattern layer.

9. The circuit board of claim 1, wherein the second circuit pattern layer protrudes downward from the second surface of the insulating layer.

10. The circuit board of claim 1, wherein at least a portion of an upper surface of the first circuit pattern layer overlaps the first protective layer in the vertical direction, and wherein at least a portion of a side surface of the first circuit pattern layer is covered with the insulating layer.

11. The circuit board of claim 1, wherein an outer surface of the insulating layer is located further outward than an outer surface of the first protective layer.

12. The circuit board of claim 11, wherein the outer surface of the insulating layer is located further outward than an outer surface of the second protective layer.

* * * * *